US006252285B1

United States Patent
Furumiya et al.

(10) Patent No.: US 6,252,285 B1
(45) Date of Patent: *Jun. 26, 2001

(54) EFFICIENT INSPECTION OF LIGHT-GATHERING RATE OF MICROLENS IN SOLID STATE IMAGING DEVICE

(75) Inventors: Masayuki Furumiya; Yasutaka Nakashiba; Tohru Yamada; Katsumi Yamamoto; Keiichi Hara, all of Tokyo (JP)

(73) Assignees: NEC Corporation; Toppan Printing Co., Ltd., both of Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,299

(22) Filed: Apr. 8, 1999

(30) Foreign Application Priority Data

Apr. 20, 1998 (JP) .................................... 10-109739

(51) Int. Cl.[7] ...................... H01L 27/148; H01L 29/768
(52) U.S. Cl. .................... 257/432; 257/232; 257/233; 348/297; 348/298; 438/60; 438/75
(58) Field of Search ................................ 257/232, 233, 257/432; 348/297, 298; 438/59, 60, 75

(56) References Cited

U.S. PATENT DOCUMENTS

| 5,583,354 | * | 12/1996 | Ishiba .................................... 257/232 |
| 5,895,943 | * | 4/1999 | Park et al. ............................ 257/232 |
| 6,008,511 | * | 12/1999 | Tokumitsu et al. ................... 257/232 |

FOREIGN PATENT DOCUMENTS 7-161794    6/1995   (JP) .

* cited by examiner

Primary Examiner—Ngân V. Ngô
(74) Attorney, Agent, or Firm—Young & Thompson

(57) ABSTRACT

A solid state imaging device includes a plurality of photoelectric conversion elements arranged in an imaging area of a semiconductor substrate. Above each of the photoelectric conversion elements, a light-gathering microlens for gathering light on the photoelectric conversion element is disposed. Further, a microlens for shape inspection having the same shape as that of the light-gathering microlens is disposed outside the imaging area. A base pattern for inspection is disposed below the microlens for shape inspection. The shape of the microlens for shape inspection is inspected through observing an image of the base pattern through the microlens for shape inspection. A result of this inspection applies as it is to the light-gathering microlenses.

21 Claims, 28 Drawing Sheets

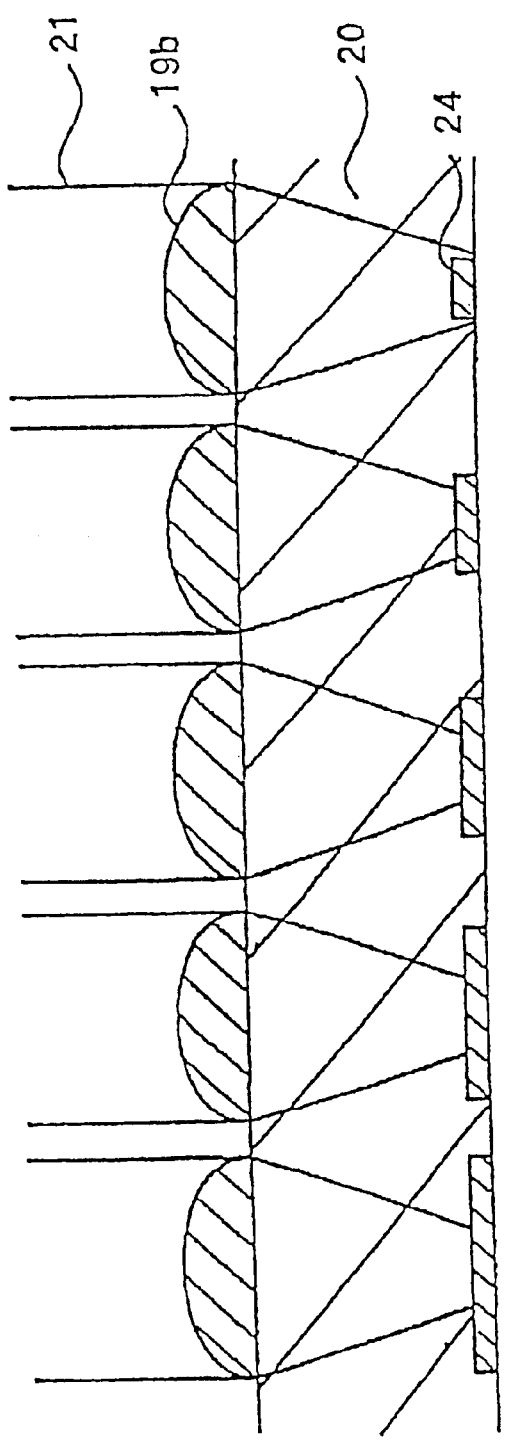

vertical direction (Y direction)

horizontal direction (X direction)

EFFICIENT INSPECTION OF LIGHT-GATHERING RATE OF MICROLENS IN SOLID STATE IMAGING DEVICE

BACKGROUND OF THE INVENTION

1. Field of the Invention

The present invention relates to a solid state imaging device and an inspection method and a production method of the same, and more particularly to a solid state imaging device having on-chip microlenses and an inspection method and a production method of the same.

2. Description of the Related Art

In recent years, there have been increasingly developed solid state imaging devices for video cameras and image input cameras for personal computers. With the popularization of a solid state imaging device, higher performances have been required for it. In particular, increase of the number of pixels and miniaturization of solid state imaging device are essential problems to be tackled for the development. For example, as regards increase of the number of pixels, the number of pixels in a digital still camera application which has become popularized recently appears to increase from 330,000 pixels (640 dots by 480 dots) to 1,300,000 pixels (1,280 dots by 1,024 dots). Meanwhile, as regards miniaturization, in a solid-state imaging device of the class of 330,000 pixels, the main current till now appears to change from a ⅓ inch format (5.5 mm diagonally) to a ¼ inch format (4 mm diagonally).

Such increase of the number of pixels and miniaturization of a solid-state imaging device force reduction of the pixel size. In the aforementioned solid-state imaging device of the class of 330,000 pixels, if a pixel is of a square shape, one side of the pixel is approximately 6.8 μm in the ⅓ inch format, while one side of a pixel is 5.0 μm in the ¼ inch format. As the pixel size decreases, the mount of incident light also decreases, resulting in a drop in the sensitivity. This deteriorates the SN ratio and hence deteriorates the picture quality. Therefore, there arises a problem how to attain a high sensitivity even when the pixel size is small. In order to solve the problem, a construction has heretofore been employed wherein an on-chip microlens is formed on a photodiode to increase the light-gathering rate to the photodiode.

A construction of a conventional solid-state imaging device will be described below in detail. First, a conventional popular interline type CCD (Charge-coupled device) imaging device will be described.

Referring to FIG. 1, there is illustrated an interline type CCD imaging device which includes an imaging area 101 at a central portion of one major surface of a semiconductor substrate, a horizontal CCD 102 adjacent to imaging area 101, and an output section (charge detector) 103 for horizontal CCD 102, and the remaining portion forms a field area 108. Arranged in a two-dimensional matrix in imaging area 101 are a plurality of photodiodes 104 which are photoelectric conversion elements for converting light into signal charge and storing the signal charge.

A vertical CCD 105 for transferring signal charge in a vertical direction is positioned adjacent each row of photodiodes 104. A readout area 106 for reading signal charge from photodiode 104 to vertical CCD 105 is provided between each photodiode 104 and adjacent vertical CCD 105. The portion in imaging area 101 other than the elements described forms an element separation area 107. Vertical CCDs 105 are connected to horizontal CCD 102. Though not shown in FIG. 1, a light-gathering microlens 119 which will be described later is provided above each of photodiodes 104.

FIG. 2 shows a cross section of one of pixels of such a CCD imaging device as described above. P-type well 110 is formed on N-type substrate 109, and N-type photodiode layer (photodiode) 104 which performs photoelectric conversion and stores the resulting signal charge, N-type vertical CCD buried layer 112 for transferring charge in a vertical direction, and a readout area 106 for reading charge from photodiode 104 to vertical CCD buried layer 112 are formed in P-type well 110. P-type vertical CCD well layer 113 is formed below vertical CCD buried layer 112, and high concentration P-type impurity layer 114 is formed on a surface of photodiode 104 and in element separation area 107. Vertical CCD transfer electrode 116 is formed on vertical CCD buried layer 112 with insulating layer 115 interposed therebetween. A light intercepting film 117 is also formed on vertical CCD transfer electrode 116 with insulating layer 115 interposed therebetween, and photodiode 104 has a light intercepting film opening 118 formed thereon. Vertical CCD 105 described above comprises vertical CCD buried layer 112, P-type vertical CCD well layer 113, vertical CCD transfer electrode 116 and so forth.

A flattened layer 120 is formed on the semiconductor substrate, on which a light-gathering microlens 119 is formed in register with each light intercepting film opening 118. Light-gathering microlens 119 serves as a convex lens and gathers incident light 121 to photodiode 104 through light intercepting film opening 118 to thereby achieve improvement of the sensitivity. FIG. 2 shows a construction having a flattened layer 120 made of a uniform substance, while FIG. 3 shows a construction of another color imaging device wherein a desired color layer 122 for each pixel is formed in flattened layer 120. The construction shown in FIG. 3 is same as that shown in FIG. 2 except color layer 122.

A method of forming this imaging device will be described by way of example. As shown in FIG. 4, through not described in detail, P-type well 110, photodiode 104, vertical CCD buried layer 112, P-type vertical CCD well layer 113, high concentration P-type impurity layer 114 and so forth mentioned above are formed on semiconductor substrate 109 semiconductor manufacturing process which is usually employed. Insulating layer 115 is then formed above.

Thereafter, vertical CCD transfer electrode 116, light intercepting film 117, light intercepting film opening 118 and so forth are formed as shown in FIG. 5, to complete a base of the imaging device. Then, as shown in FIG. 6, flattened layer 120 made of, for example, an acrylic resin is formed on the base of the imaging device formed by the semiconductor manufacturing process. For the imaging device of the single plate color type, a desired color layer (color layer of a pigment type material or color layer of a dye type material) is formed for each pixel (however, in an imaging device of any type other than the single plate color type, this color layer 122 may not be formed). Further, in order to keep the flatness after formation of color layer 122, an additional flattened layer 120 is sometimes formed. Thereafter, as shown in FIG. 7, a lithography technique is utilized to pattern a resin, which is made of, for example, an acrylic resin, above each light intercepting film opening 118, that is, at each portion at which a convex lens is to be formed. This resin forms base material 119a of light-gathering microlenses 119. Thereafter, light-gathering microlenses 119 of the convex lens type having a desired curvature are formed, for example, by heat-reflowing, as shown in FIG. 3, to complete the imaging device.

Each light-gathering microlens 119 is shaped in a convex lens configuration and dimensioned such that all incident light 121 may be gathered upon photodiode 104. For forming light-gathering microlenses 119, an optical simulation is performed to determine a suitable thickness of flattened layer 120 and a height and a width of light-gathering microlenses 119. In the manufacturing process, the film thickness of flattened layer 120 and the height of light-gathering microlenses 119 will be controlled by monitoring the film thickness of, for example, an acrylic resin upon application and performing a forming step while confirming that the film thickness is suitable. The convex lens surfaces of light-gathering microlenses 119 are formed in desired shapes by monitoring the shape upon patterning by the lithography technique and controlling the temperature and the time in a reflowing step.

Despite the aforementioned control in the manufacturing process of light-gathering microlenses 119, an appropriate thickness of flattened layer 120 and an appropriate shape of light-gathering microlenses 119 may not be obtained. In this instance, light-gathering microlenses 119 undergo a visual inspection using an optical microscope. If it is determined that the shape of a light-gathering microlens is improper, then the imaging device is determined to be defective. The imaging device which has been determined to be defective is re-formed after the removal of light-gathering microlenses 119 or flattened layer 120 made of an acrylic resin.

However, a visual inspection by means of an optical microscope is allowed to check only very distinct visually-distinguishable shape defects, for example, a defective shape wherein light-gathering microlenses 119 be isolated from each other are in contact with each other.

An imaging apparatus that has been determined to be defective in a visual inspection is thereafter subject to an actual driving examination wherein the imaging device is actually driven, and electro-optical characteristics of the imaging apparatus are measured. The actual driving examination is cumbersome in that it must be done for each one chip and takes much time.

An imaging apparatus which is determined to be defective in the actual driving examination may actually involve defective in the shape of light-gathering microlenses 119 which should have been detected by a visual inspection. However, fine defects in defect are as mentioned, frequently overlooked in an inspection by means of an optical microscope, and are sometimes found at last in an actual driving examination. When defects are overlooked in a visual inspection, an actual driving examination must be performed, increasing a testing time. This increases the turn around time (TAT) of the manufacturing process lowering productivity.

SUMMARY OF THE INVENTION

It is an object of the present invention to provide a solid state imaging device which makes it possible to detect a shape defect of a microlens with degree of reliability than ever by a visual inspection and an inspection method of the same.

According to one aspect of the invention, a solid state imaging device comprises a plurality of photoelectric conversion elements, a light-gathering microlens, and a microlens of the identical shape with the light-gathering microlens. The photoelectric conversion elements are arranged in an imaging area of a principal surface of a semiconductor substrate. The light-gathering microlens is disposed above each of the photoelectric conversion elements and acts to gather light on the photoelectric conversion element. The microlens for shape inspection is disposed outside the imaging area of the semiconductor substrate.

This construction enables a visual inspection without using the light-gathering microlens for use in actual imaging. This, in turn, allows working of the semiconductor substrate outside the imaging area to facilitate a visual inspection of the microlens for shape inspection.

Preferably, a base pattern for inspection is formed below the microlens for shape inspection. This construction, enable a visual inspection of the microlens for shape inspection with a greater accuracy by utilizing the base pattern.

When a plurality of microlenses for shape inspection are arranged, the base patterns associated with the microlenses for shape inspection may differ from each other. Preferably, all of the base patterns are smaller than the microlenses for shape inspection.

When a plurality of the microlenses for shape inspection are aligned in a row, the base patterns may be narrow rectangular in shape extending in the direction of arrangement of the microlenses for shape inspection. In this instance, the widths of the base patterns are preferably smaller than that of the microlenses for shape inspection. Further, in the case of a plurality of rows of the microlenses for shape inspection are provided, the widths of the base patterns are preferably differ among the microlens rows for shape inspection.

With a solid state imaging device as configured above, observing images of the base patterns through the microlenses for shape inspection enables the shape of the microlenses for shape inspection to be inspected.

According to another aspect of the invention, a method of manufacturing a solid state imaging device comprises the steps of arranging a plurality of photoelectric conversion elements in an imaging area of one principal surface of a semiconductor substrate, and forming, above the photoelectric conversion elements, light-gathering microlenses for gathering light to the photoelectric conversion elements and, outside the imaging area of the semiconductor substrate, a microlens for shape inspection be of identical shape with the light-gathering microlenses.

Preferably, the light-gathering microlenses and the microlens for shape inspection are preferably formed simultaneously.

Also preferably, a base pattern for inspection is formed outside the imaging area of the semiconductor substrate, and then, the microlens for shape inspection is formed on the base pattern.

The base pattern may be formed from a metal film pattern, a polycrystalline silicon film pattern or a pattern provided by a shoulder of an insulating film.

The present invention provides determination as to whether or not the shape of a microlens is acceptable to detect a shape defect of the microlens without testing an electro-optical characteristic of an imaging device. Consequently, the working efficiency when a defective product is detected, is remarkably improved as compared with a case wherein an imaging device is under test of an electro-optical characteristic after it is completed, and then working is again carried out, as in the prior art.

In addition, when various working conditions (a reflowing temperature, a reflowing time and so forth) are tried to determine optimum conditions at the prototyping stage of trial production of an imaging device, the optimum conditions can be determined only through observation by means of a microscope without evaluating an electro-optical characteristic of the imaging device. This results in the reduction of the turn around time (TAT) for development.

The above and other objects, features and advantages of the present invention will become apparent from the following description with reference to the accompanying drawings which illustrate examples of the present invention.

BRIEF DESCRIPTION OF THE DRAWINGS

FIG. 18 is an enlarged sectional view of essential part showing an example wherein another base pattern is formed on the imaging device shown in FIG. 8;

DETAILED DESCRIPTION OF THE PREFERRED EMBODIMENTS

Figure 8:
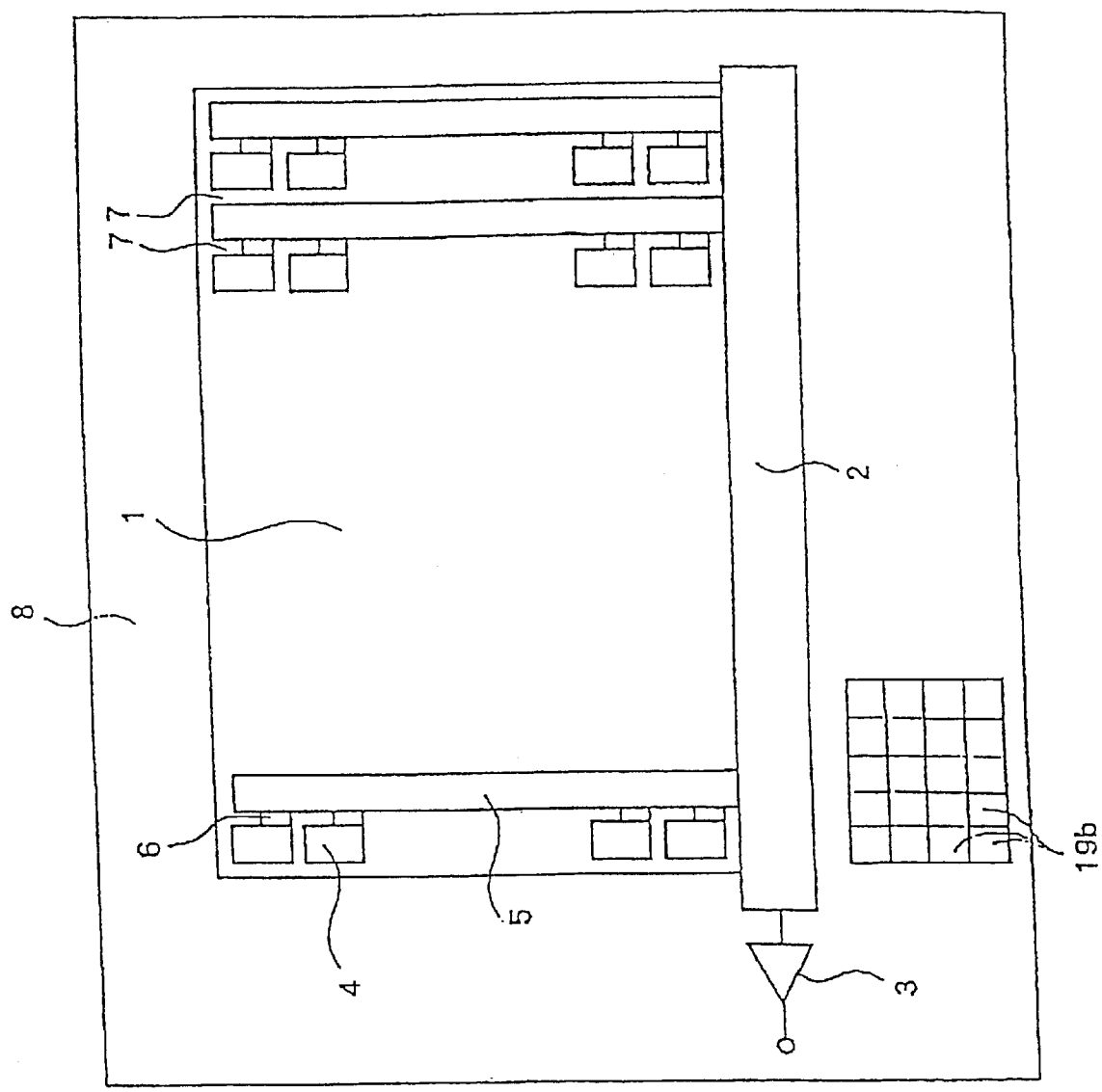
FIG. 8 is a plan view of an interline type CCD imaging device according to a first embodiment of the present invention.

Referring to FIG. 8, there is illustrated a solid state imaging device according to an embodiment of the present invention. The solid state imaging device of the present embodiment has a construction substantially same as that of the conventional apparatus described hereinabove except a microlenses 19*b* for shape inspection and base patterns 23 which will be hereinafter described, and therefore, brief description thereof will be given herein.

Imaging area 1 is provided at a central location of one of principal surfaces of a semiconductor substrate (N-type substrate: refer to FIGS. 10 to 14), and horizontal CCD 2 and output section (charge detector) 3 for horizontal CCD 2 are provided adjacent imaging area 1. The remaining portion of the principal surface of the semiconductor substrate forms field area 8. A plurality of photodiodes (photoelectric conversion elements) 4 are arranged in a two-dimensional matrix in imaging area 1. Vertical CCD (charge coupled device) 5 is provided adjacent each row of photodiodes 4, and readout area 6 is provided between photodiode 4 and vertical CCD 5. The portion in horizontal CCD 2 other than the components mentioned above forms element separation area 7. Vertical CCDs 5 are connected to horizontal CCD 2. Though not shown in FIG. 8, light-gathering microlens 19*a* (refer to FIG. 10) which will be hereinafter described is provided above each of photodiodes 4.

Base patterns 23 which will be hereinafter described are formed in field area 8, and microlenses 19*b* for shape inspection are provided on base patterns 23. Microlenses 19*b* for shape inspection are simultaneously formed in the same shape as that of light-gathering microlenses 19*a*.

Figure 1:
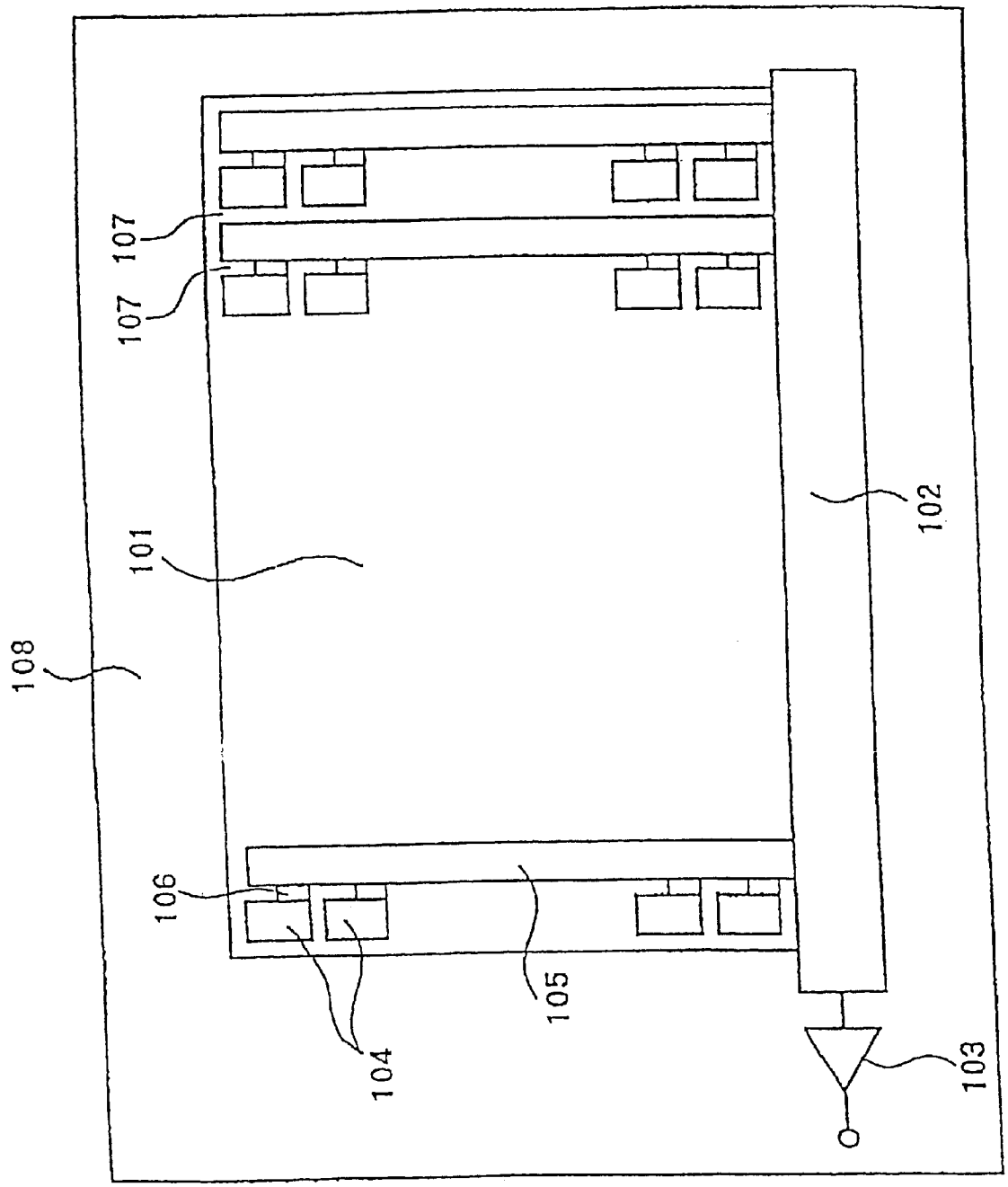
FIG. 1 is a plan view of a conventional interline type CCD imaging device.
Figure 2:
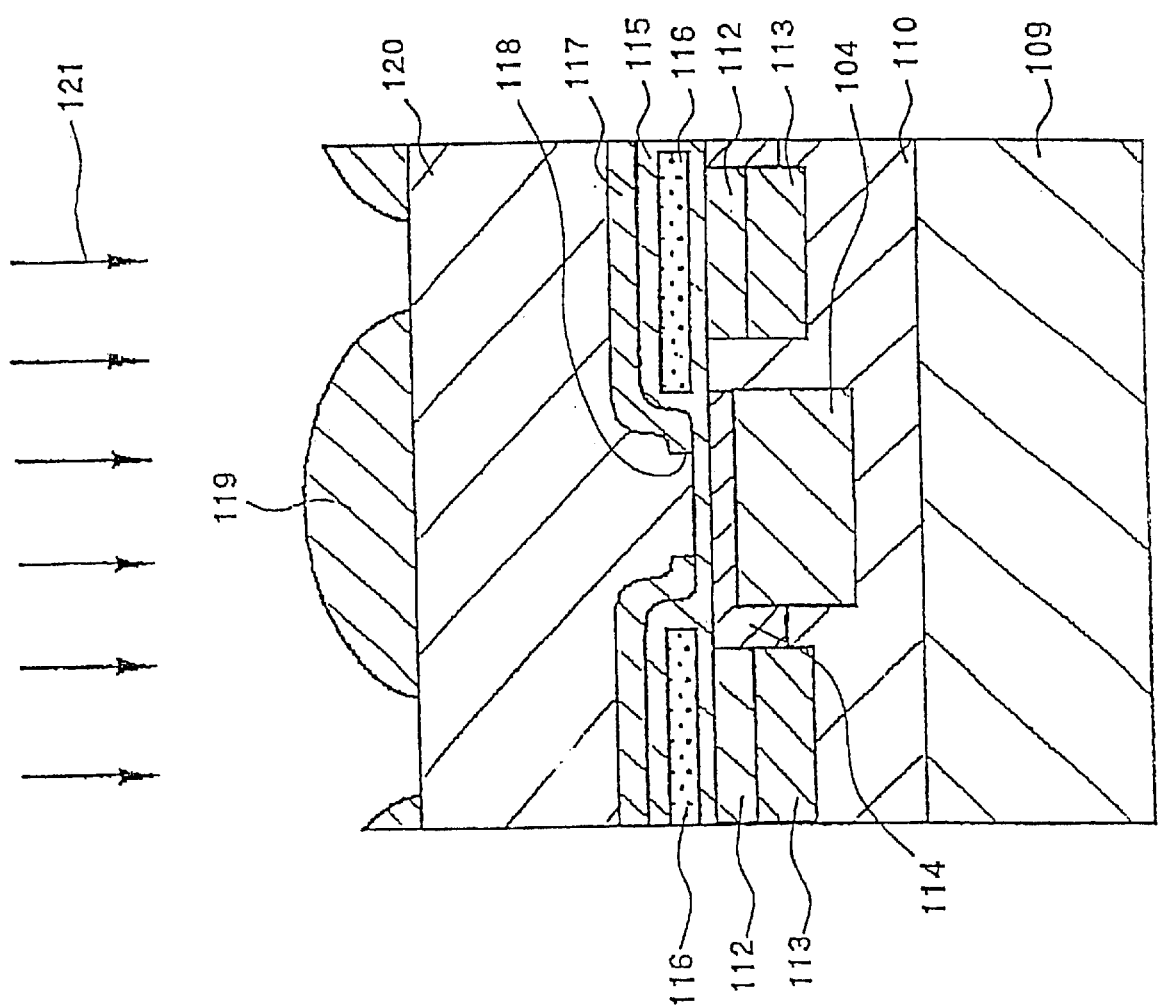
FIG. 2 is a sectional view of the conventional imaging device.
Figure 3:
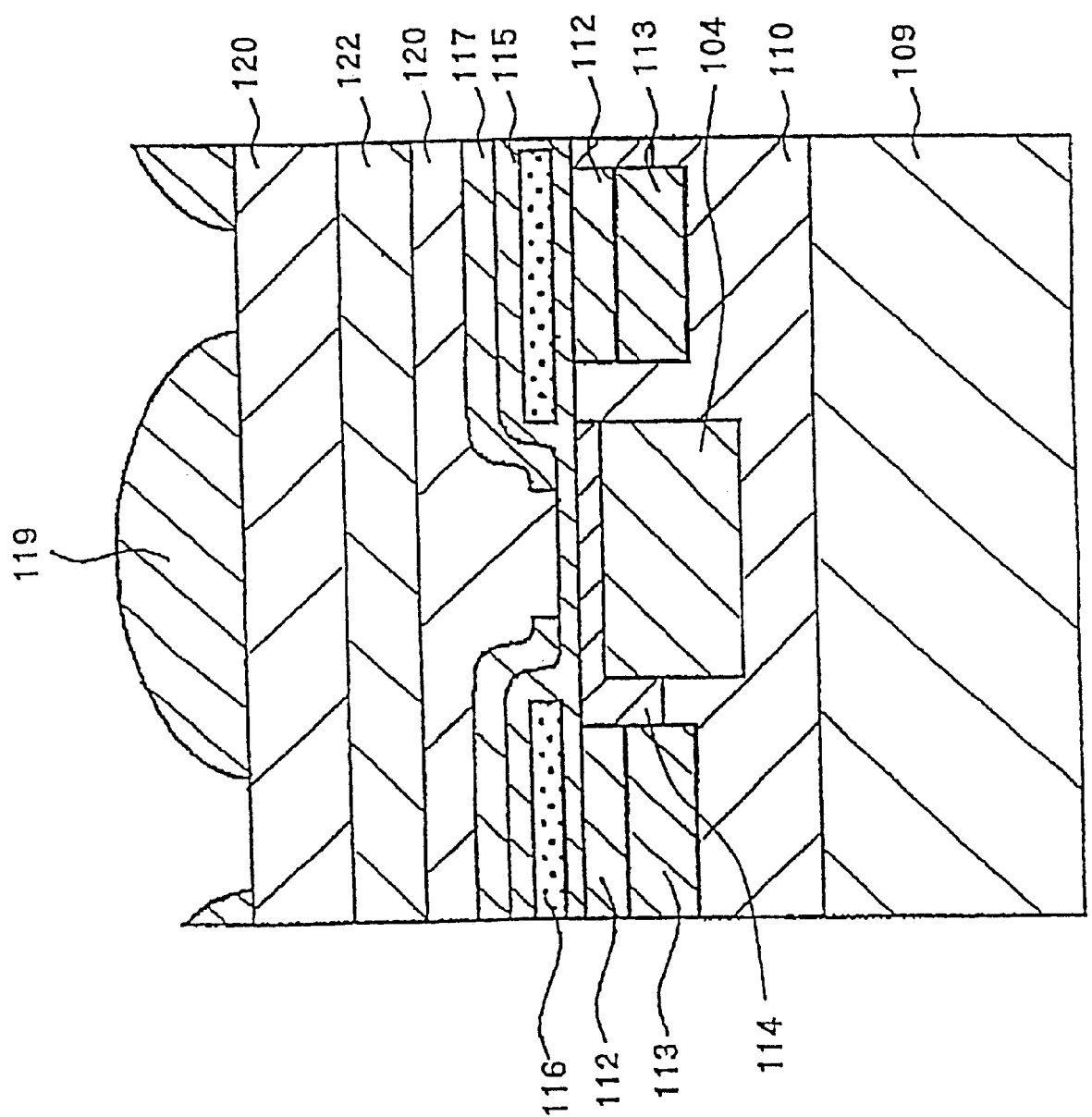
FIG. 3 is a sectional view of another conventional imaging device.
Figure 4:
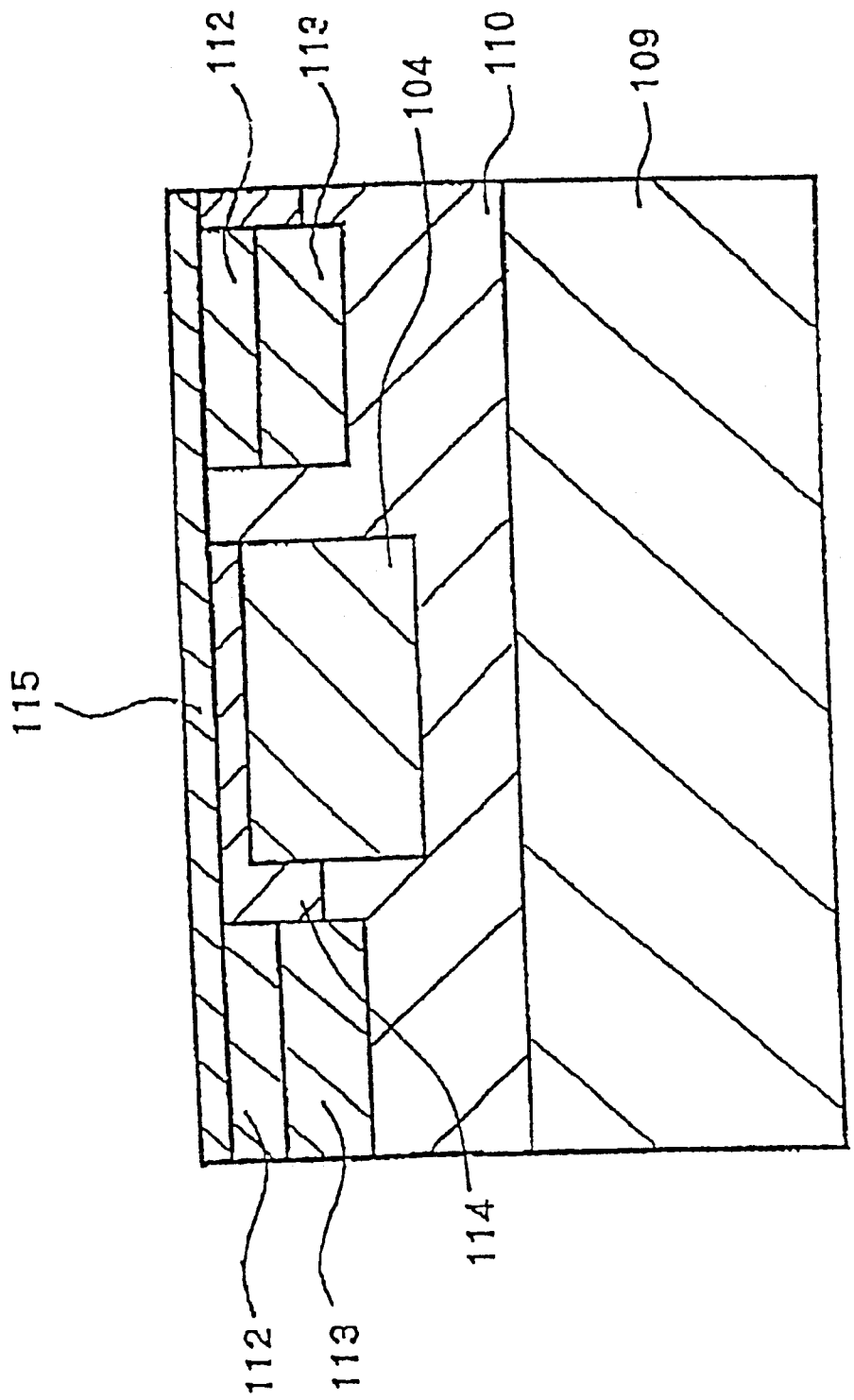
FIG. 4 is a sectional view illustrating a first step of a manufacturing process of the imaging device shown in FIG. 3.
Figure 5:
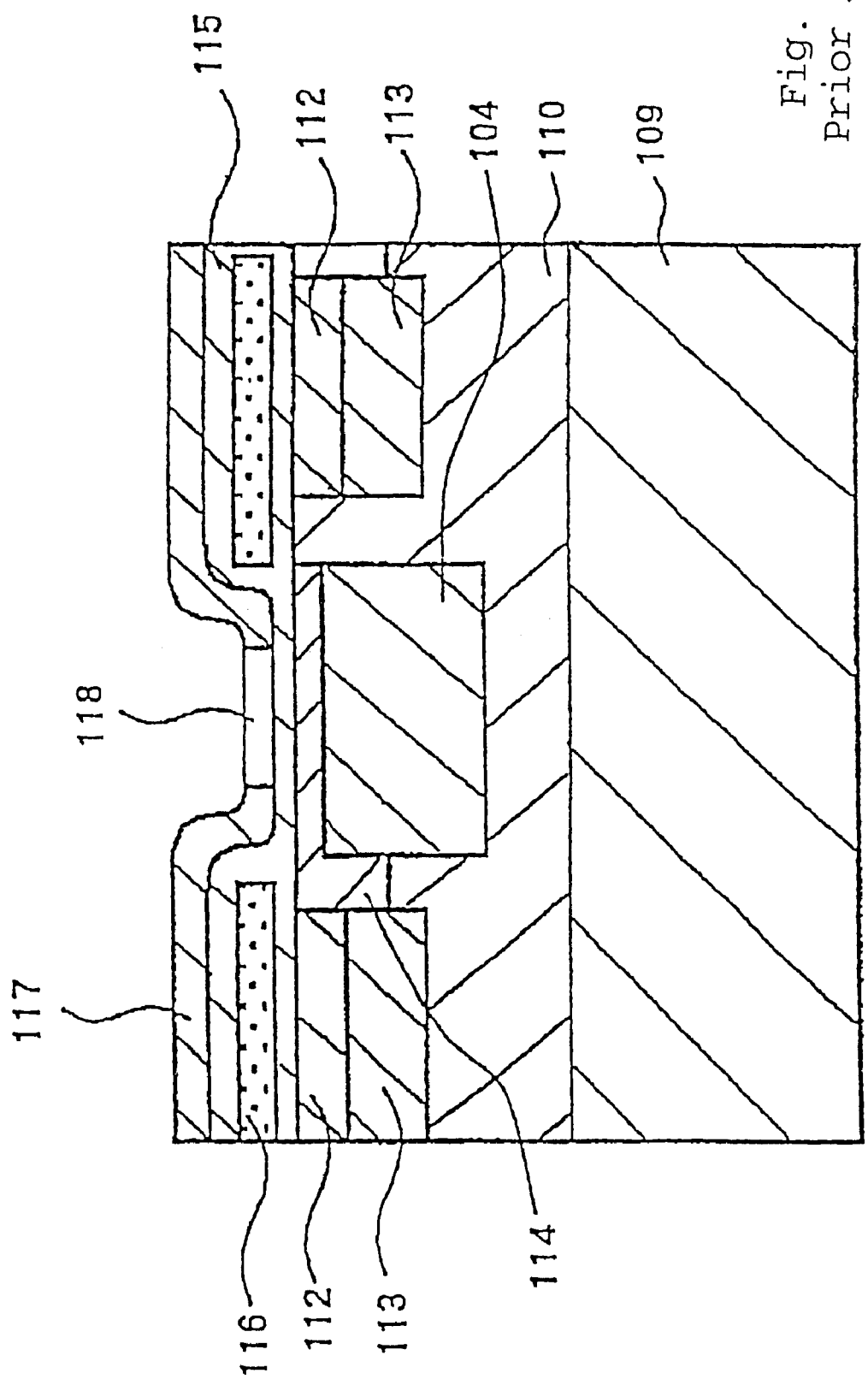
FIG. 5 is a sectional view illustrating a second step of the manufacturing process of the imaging device shown in FIG. 3.
Figure 6:
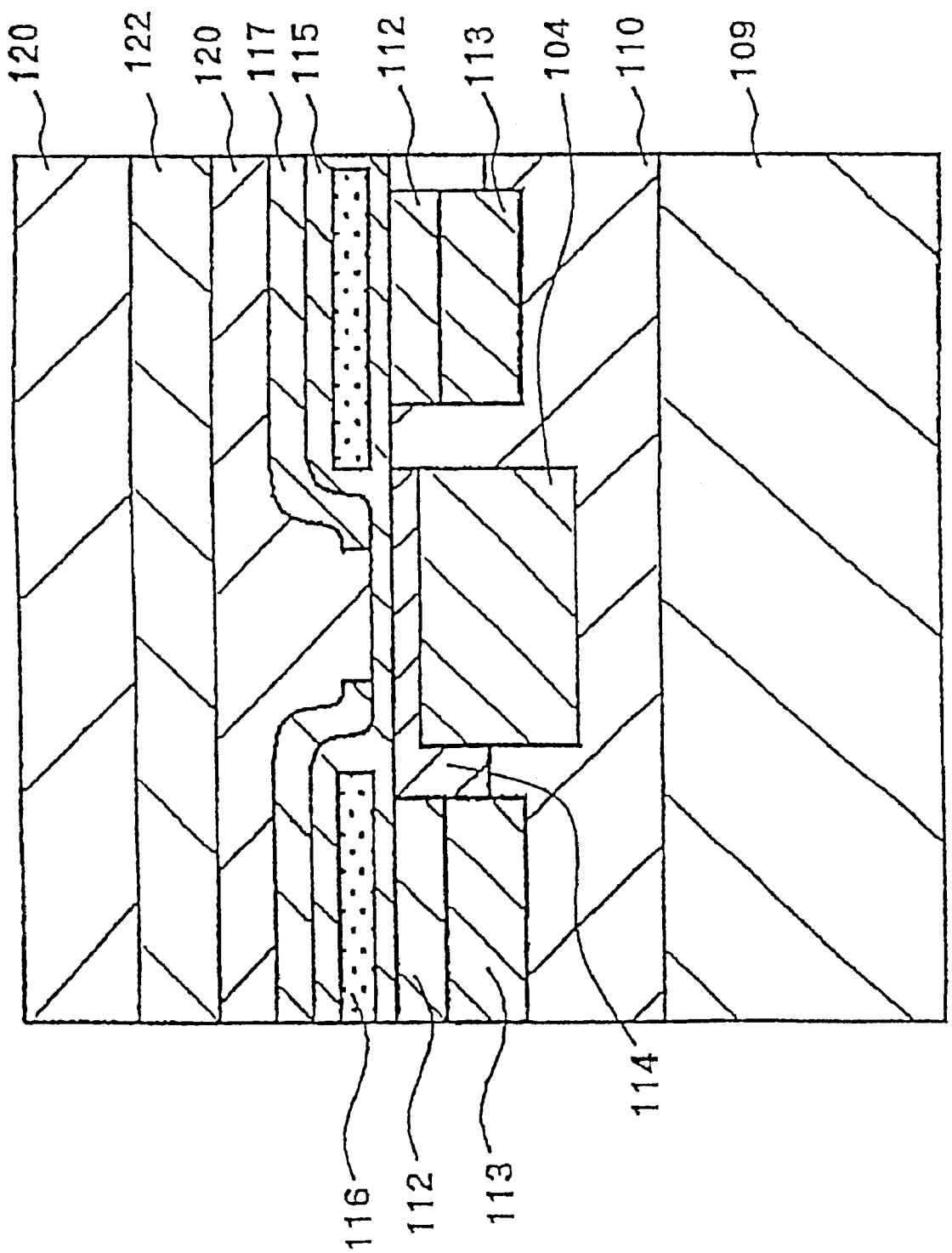
FIG. 6 is a sectional view illustrating a third step of the manufacturing process of the imaging device shown in FIG. 3.
Figure 7:
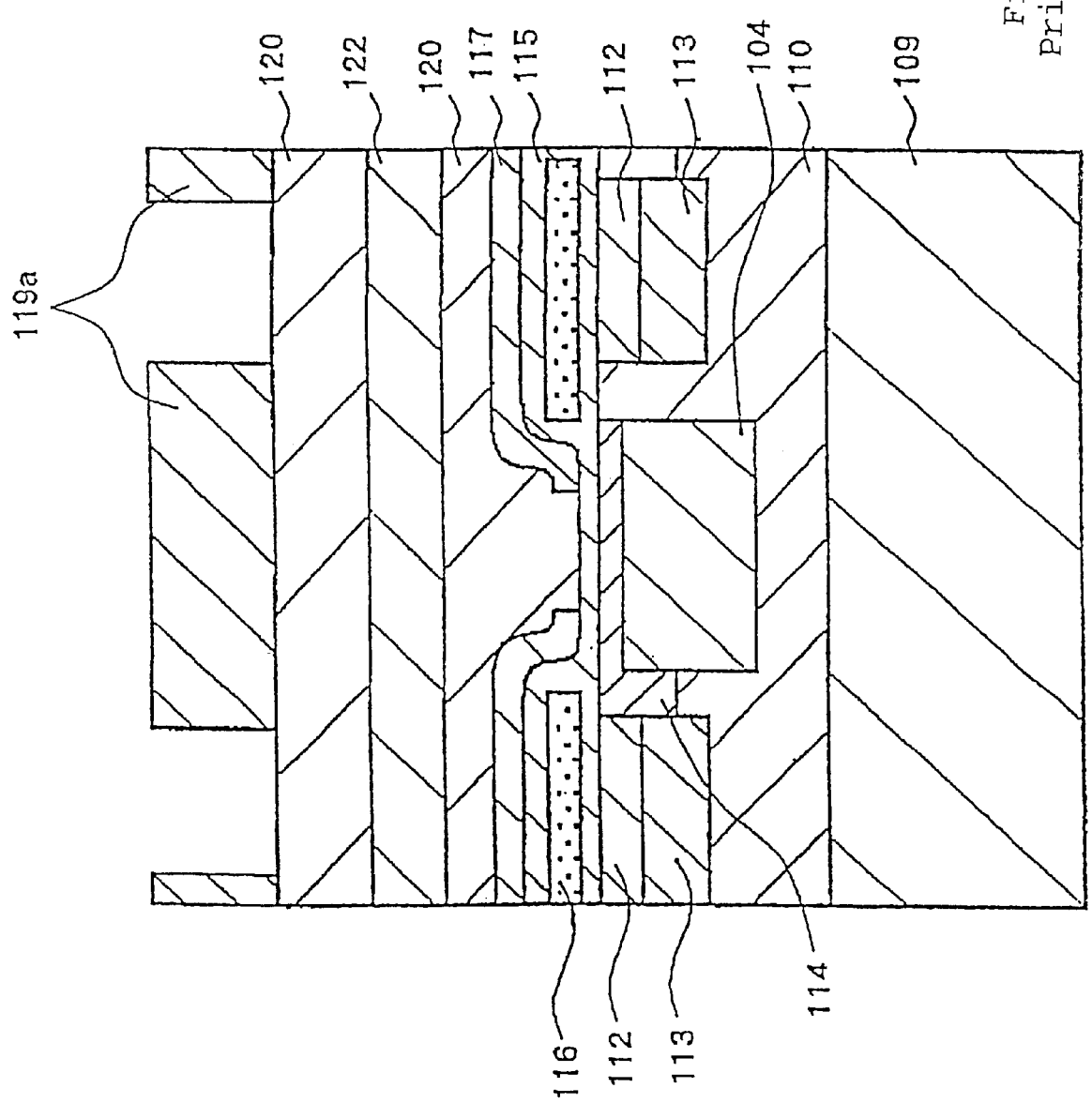
FIG. 7 is a sectional view illustrating a fourth step of the manufacturing process of the imaging device shown in FIG. 3.
Figure 9:
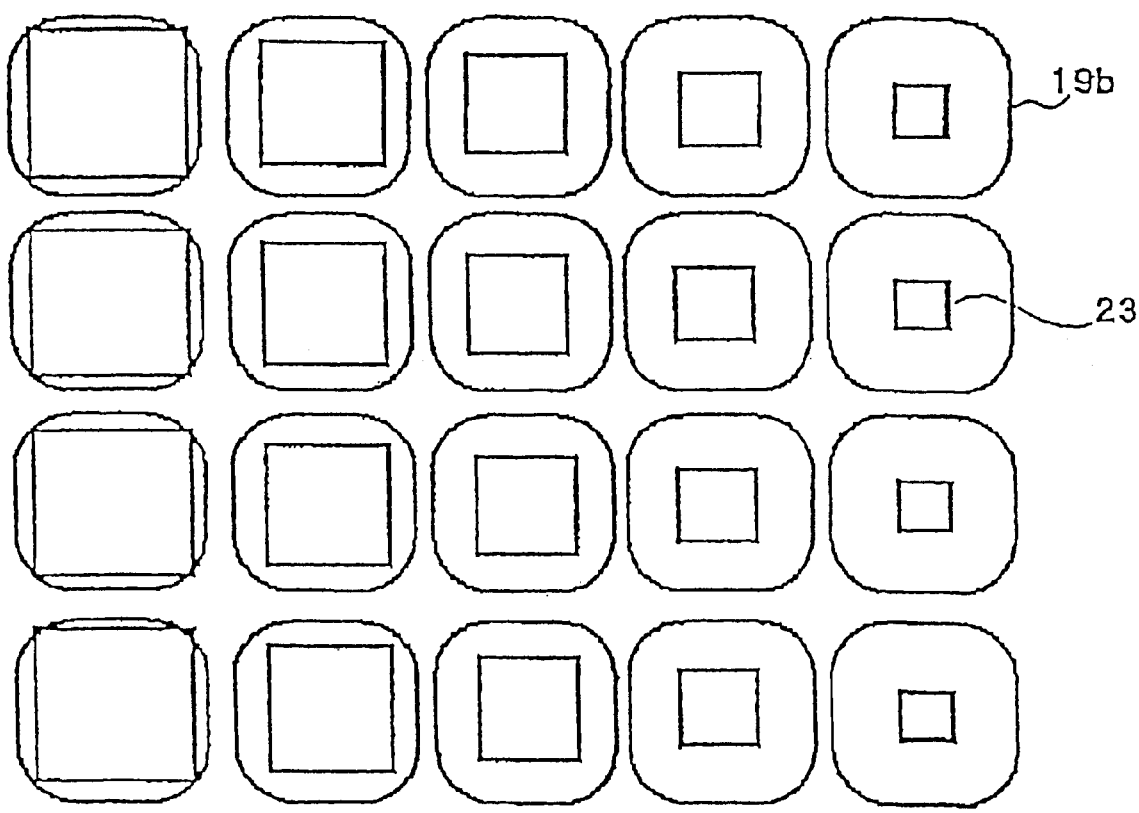
FIG. 9 is an enlarged plan view of a microlens and base pattern for shape inspection of the imaging device shown in FIG. 8.
Figure 10:
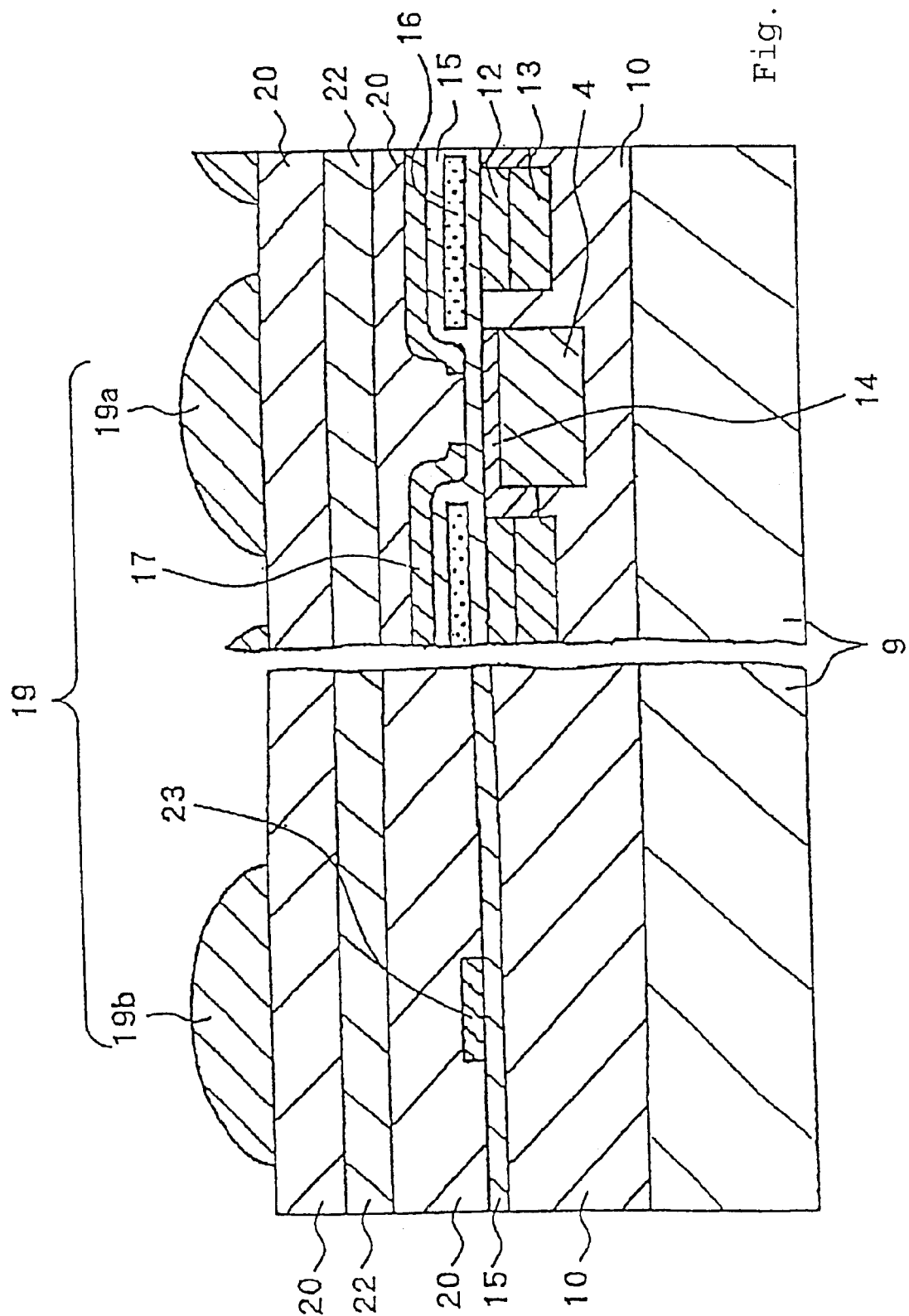
FIG. 10 is a sectional view of the imaging device shown in FIG. 8 in a completed state.

FIG. 9 is a plan view showing a portion of the CCD imaging device at which microlenses 19*b* for shape inspection are provided, and FIG. 10 shows a cross section of a portion of imaging area 1 at which light-gathering microlens 19*a* is formed and a portion of field area 8 at which microlens 19*b* for shape inspection is formed. Since imaging area 1 has a construction substantially the same as that of imaging area 101 (refer to FIG. 1) of the imaging device described as the prior art, only brief description thereof will be given.

In imaging area 1, P-type well 10 is formed on N-type substrate 9, and N-type photodiode layer (photodiode) 4, N-type vertical CCD buried layer 12 and readout area 6 are formed in P-type well 10. P-type vertical CCD well layer 13 is formed below N-type vertical CCD buried layer 12, and high concentration P-type impurity layer 14 is formed on the surface of photodiode 4 and in element separation area 7. Vertical CCD transfer electrode 16 is formed on vertical CCD buried layer 12 with insulating layer 15 interposed therebetween. Light intercepting film 17 is formed on vertical CCD transfer electrode 16 with an additional insulating layer 15 interposed therebetween, and light intercepting film opening 18 is formed on photodiodes 4. Vertical CCD 5 described includes vertical CCD buried layer 12, P-type vertical CCD well layer 13 and vertical CCD transfer electrode 16.

In field area 8 of the present embodiment, P-type well 10 is formed on N-type substrate 9, and insulating layer 15 is formed on P-type well 10. Further, base pattern 23 made of a metal film is formed.

In addition, flattened layer 20 and color layer 22 are formed in both of imaging area 1 and field area 8, and microlenses (convex lenses) 19 are formed above flattened layer 20 and color layer 22 corresponding to light intercepting film opening 18 of imaging area 1 and base pattern 23 of field area 8, respectively.

Figure 11:
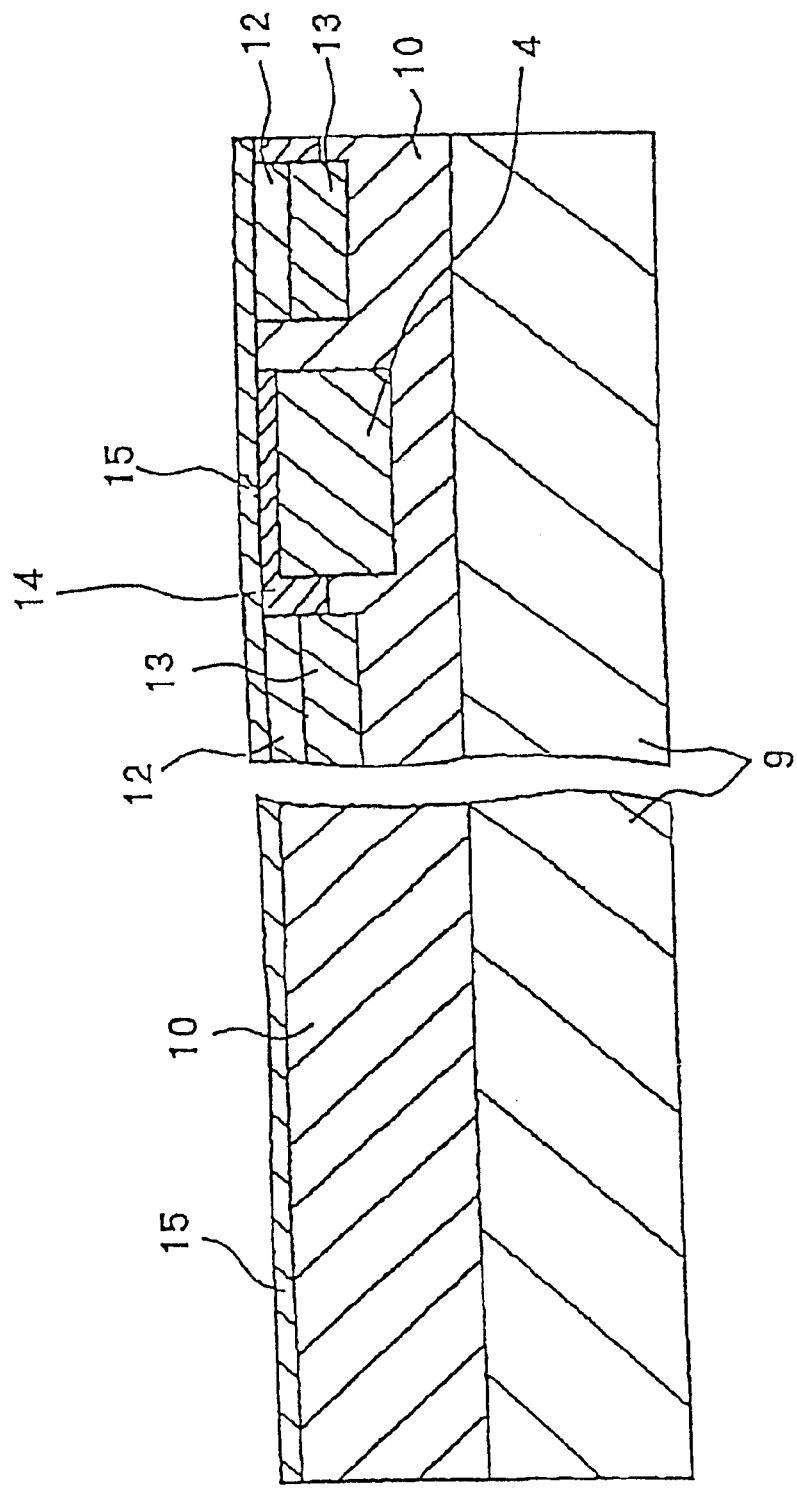
FIG. 11 is a sectional view showing a first step of a manufacturing process of the imaging device shown in FIG. 8.

A manufacturing process of the imaging device will be described below. First, P-type wells 10, photodiodes 4, vertical CCD buried layer 12 and vertical CCD well layer 13, high concentration P-type impurity layer 14, and insulating layer 15 are formed in imaging area 1 of semiconductor substrate 9 as shown in FIG. 11 by means of a conventional semiconductor manufacturing process. Meanwhile, P-type wells 10 and insulating layer 15 are formed in field area 8 simultaneously with imaging area 1.

Figure 12:
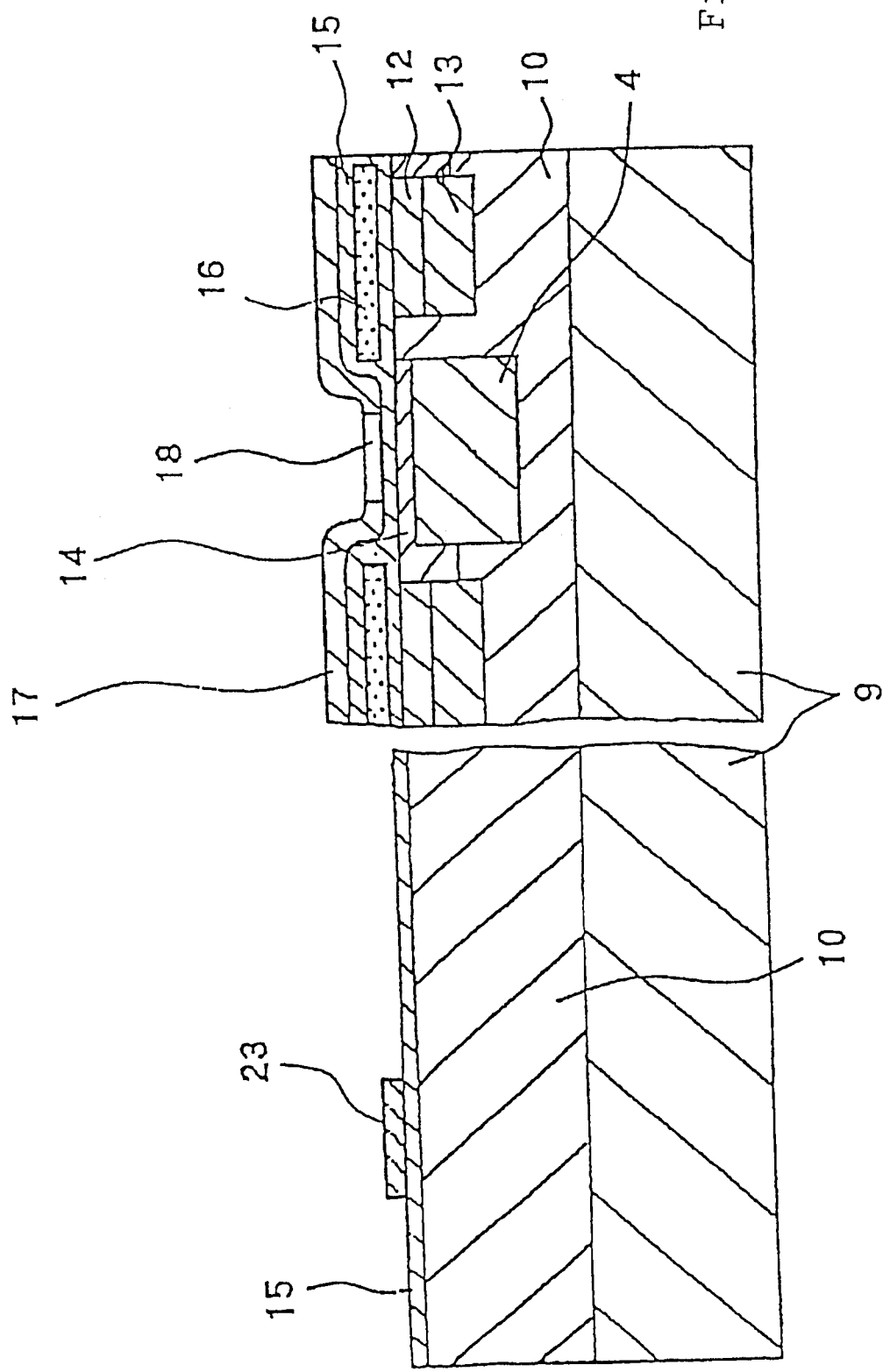
FIG. 12 is a sectional view showing a second step of the manufacturing process of the imaging device shown in FIG. 8.

Next, vertical CCD transfer electrodes 16, light intercepting film 17, light intercepting film openings 18 and so forth are formed in imaging area 1 as shown in FIG. 12. Meanwhile, a metal film is patterned to form base patterns 23 in field area 8. A base of the imaging device is thus completed.

Figure 13:
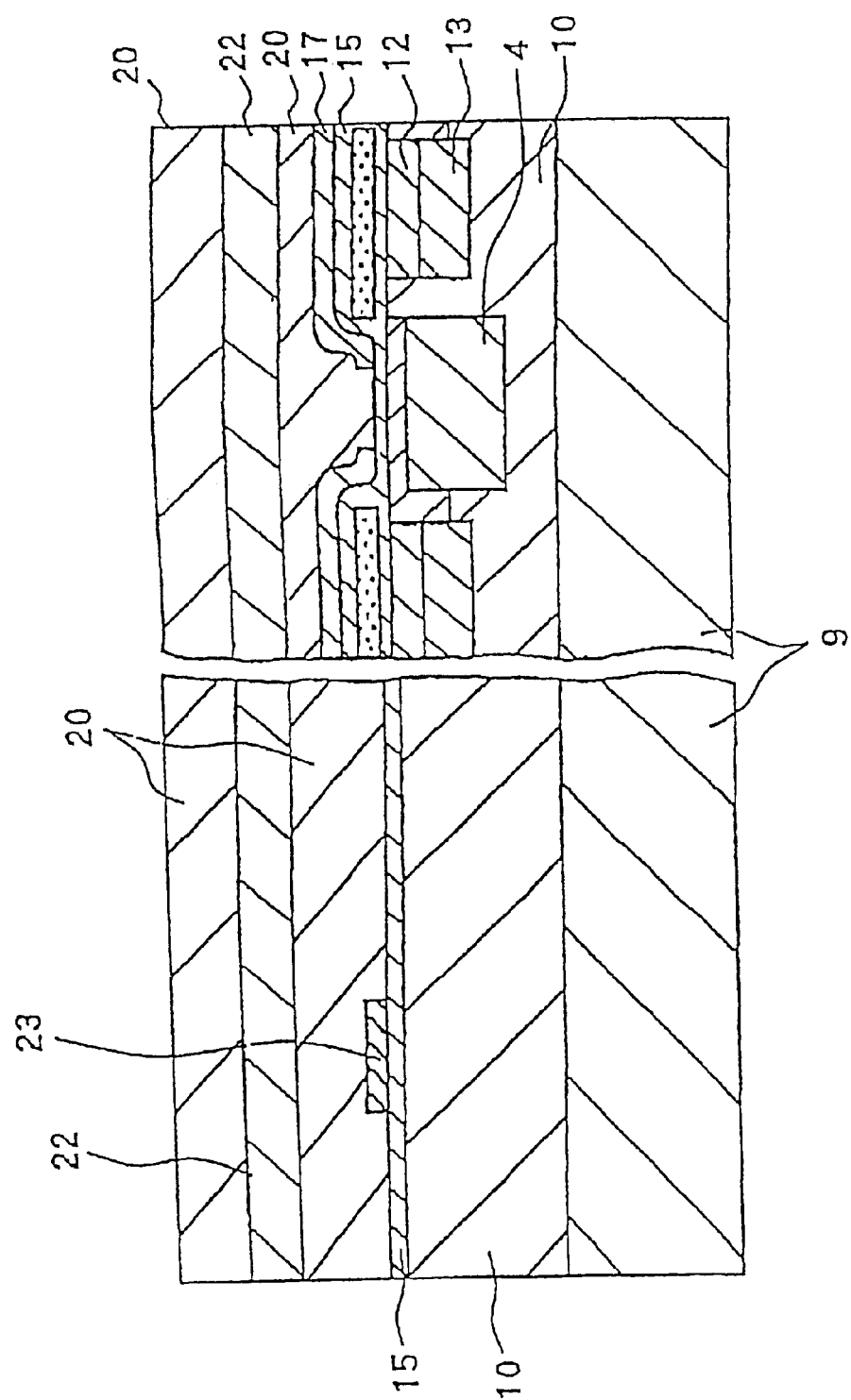
FIG. 13 is a sectional view showing a third step of the manufacturing process of the imaging device shown in FIG. 8.
Figure 14:
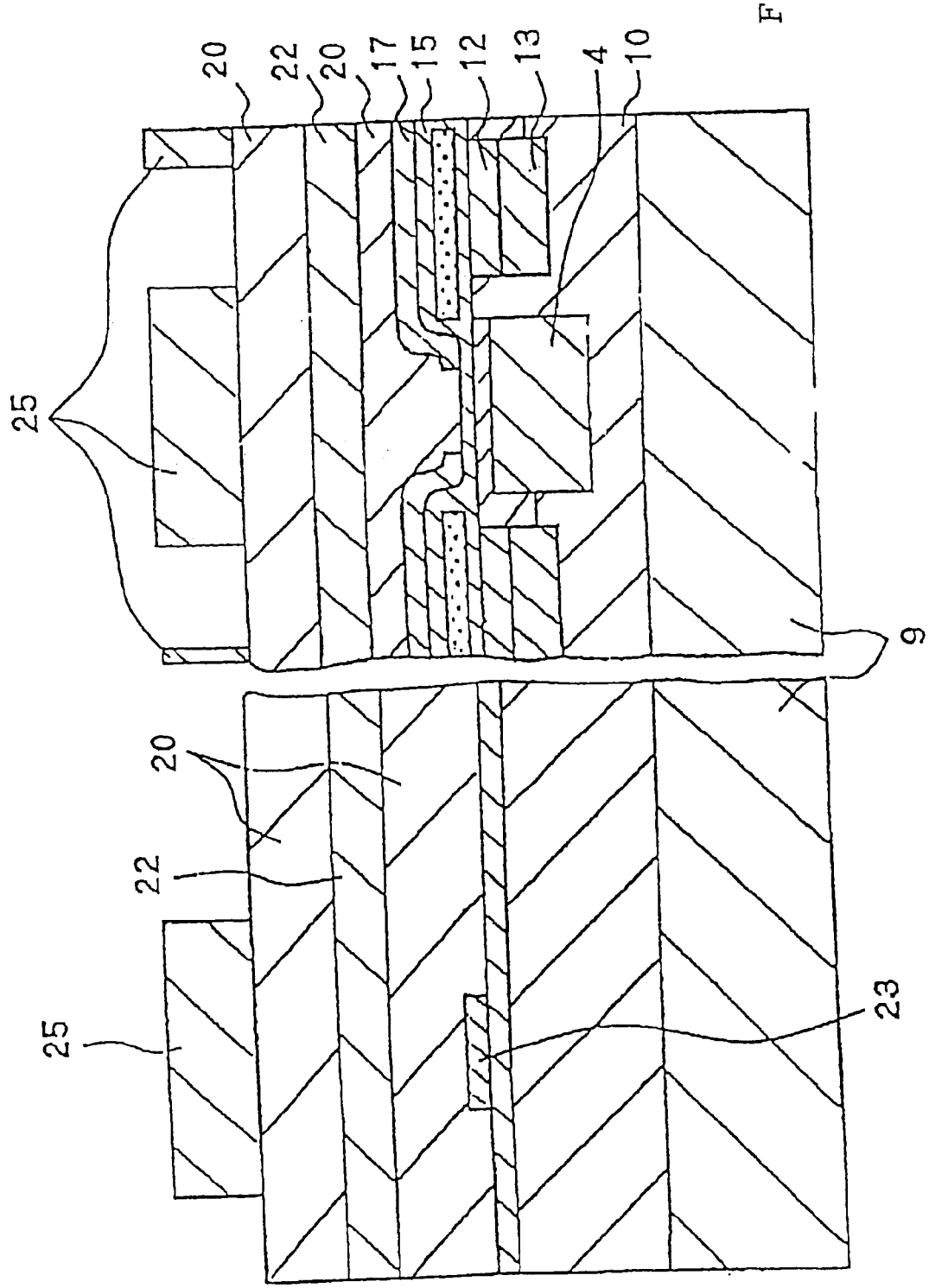
FIG. 14 is a sectional view showing a fourth step of the manufacturing process of the imaging device shown in FIG. 8.

Next, flattened layer 20 made of an acrylic resin or some other suitable material is formed on the base of the imaging device formed by means of the semiconductor manufacturing process as shown in FIG. 13. If the imaging device is of the single color plate type, desired color layer 22 is formed for each pixel. Further, in order to maintain the flatness after the color layer formation, flattened layer 20 is formed once again. Thereafter, a lithography technique is used to pattern the resin above light intercepting film openings 18 and above base patterns 23 as shown in FIG. 14. This resin serves as base material 25 of microlenses 19. Thereafter, base material 25 is worked, for example, by a reflowing step by heat such that it may have a convex lens shape with a desired curvature, to complete microlenses 19 (refer to FIG. 10). It is to be noted that the microlenses in imaging area 1 are light-gathering microlenses 19*a*, and the microlenses in field area 8 are microlenses 19*b* for shape inspection, and they are collectively referred to as microlenses 19.

Light-gathering microlenses 19*a* have a shape and a size of a convex lens such that incident light may all be gathered to photodiodes 4 in imaging area 1. Since microlenses 19*b* for shape inspection in field area 8 are formed simultaneously with light-gathering microlenses 19*a*, both microlenses 19 have the same shape and the same size. More specifically, in forming microlenses 19, an optical simulation is performed to determine the height and the width of microlenses 19 in advance. Then, for example, a step for formation is performed monitoring the film thickness of an acrylic resin upon application to confirm that the film is of suitable thickness, so that the height of microlenses 19 can be controlled. On the other hand, a step of forming convex lens curved surfaces of microlenses 19 is controlled by monitoring of the patterning shapes due to a lithography technique and by checking the temperature and the time during the reflowing step. However, despite the strict control, the microlens 19 of a specified shape and size can not be obtained due to errors in manufacture. To cope with this problem, in the present embodiment, a visual inspection is performed with base patterns 23 and microlenses 19b for shape inspection.

Figure 15:
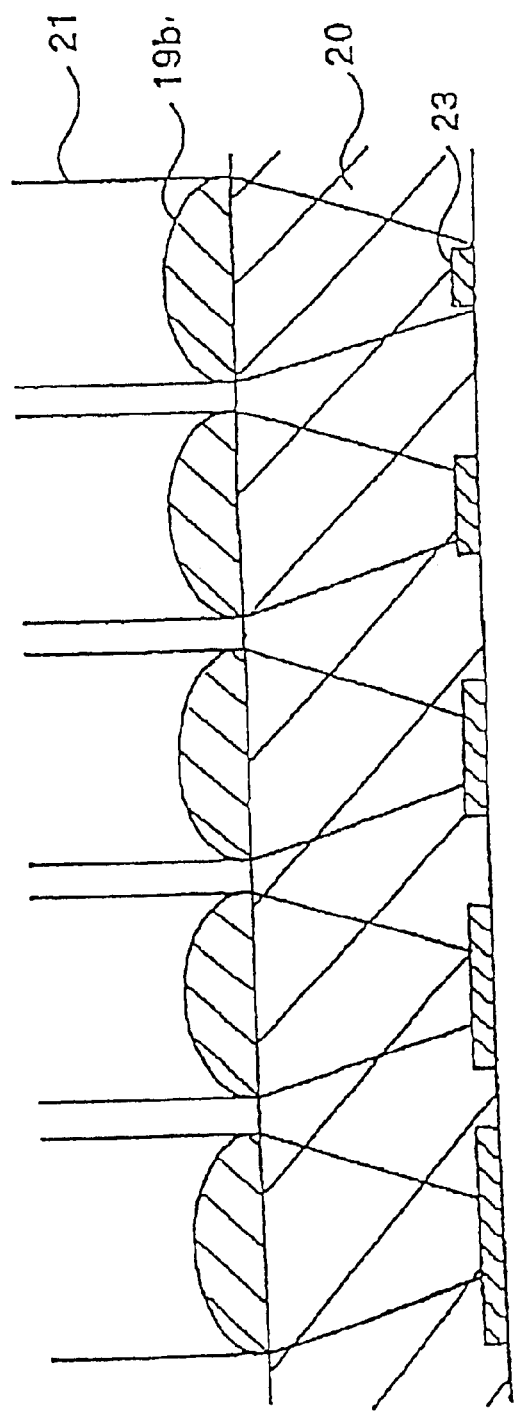
FIG. 15 is an enlarged sectional view of essential part of the imaging device shown in FIG. 8.

Base patterns 23 in the present embodiment are formed by patterning a metal film on field area 8. As shown in FIG. 9, base patterns 23 are square patterns which differ in size for individual microlenses 19b for shape inspection. FIG. 15 is a front elevational sectional view of a plurality of base patterns 23, flattened layer 20 and a plurality of microlenses 19b for shape inspection and illustrates a manner in which incident light 21 enters. For simplicity, color layer 22 is omitted in FIG. 15.

Figure 16A:
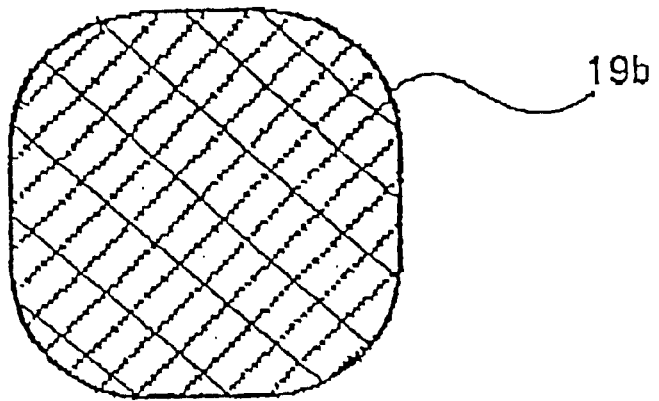
FIG. 16A is a plan view showing an image of a base pattern through a microlens for shape inspection in an example of a shape inspection of a microlens according to the imaging device shown in FIG. 8.
Figure 16B:
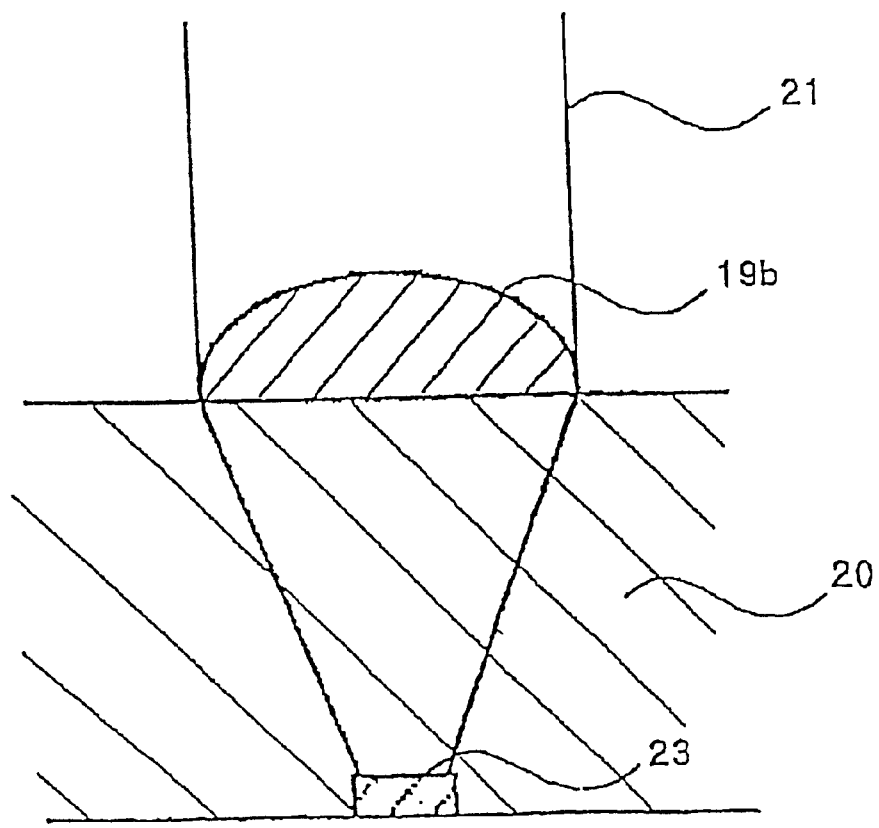
FIG. 16B is a sectional view showing an image of the base pattern through the microlens for shape inspection in the example of a shape inspection of the microlens according to the imaging device shown in FIG. 8.

A method of inspecting the shapes of microlenses 19b utilizing base patterns 23 will now be described. Base patterns 23 for shape inspection and microlenses 19b for shape inspection shown in FIGS. 9 and 15 are observed through a microscope. At this time, since base patterns 23 looks differently depending upon the shapes of microlenses 19b for shape inspection, an inspection of the shapes of microlenses 19b can be performed depending upon how base patterns 23 looks like. For example, if base pattern 23 of a predetermined size can be seen through microlens 19b with being magnified over the whole microlens 19b as shown in FIGS. 16A and 16B, then it can be determined that microlens 19 of a proper shape having a high light-gathering ratio has been formed. In the FIG. 16A, an image of the base pattern through microlens 19b is indicated by cross hatching lines.

Figure 17A:
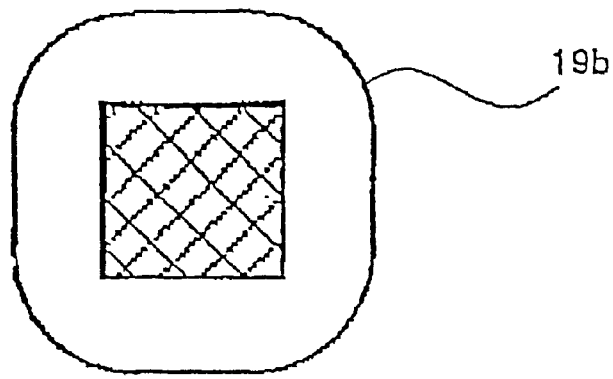
FIG. 17A is a plan view showing an image of a base pattern through a microlens for shape inspection in a different example of a shape inspection of a microlens according to the imaging device shown in FIG. 8.
Figure 17B:
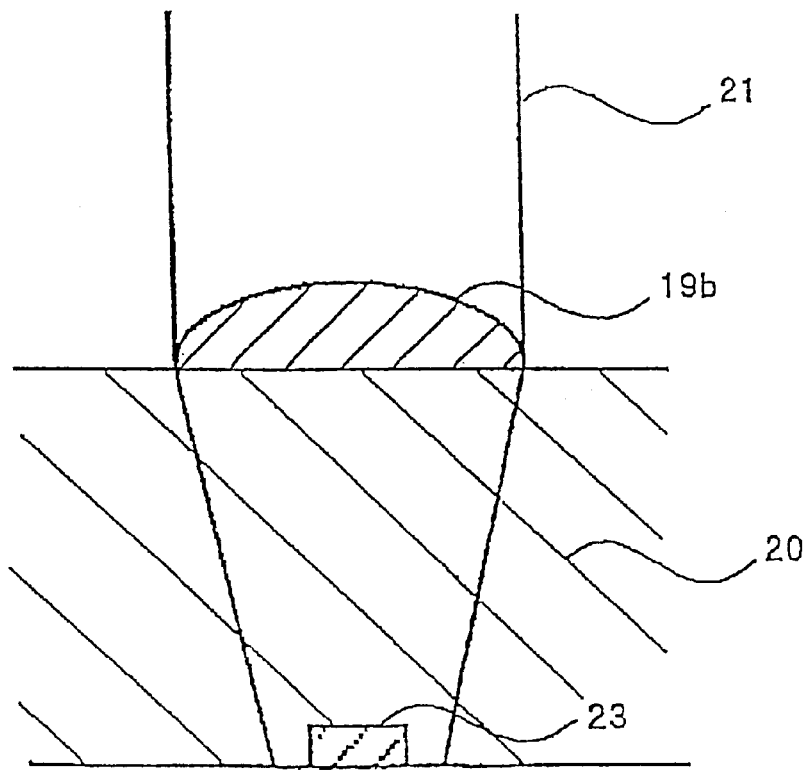
FIG. 17B is a sectional view showing an image of the base pattern through the microlens for shape inspection in the different example of a shape inspection of the microlens according to the imaging device shown in FIG. 8.

On the other hand, upon similar observation through a microscope, if the same base pattern 23 can not be seen through microlens 19b for shape inspection with being magnified over the whole microlens 19b but seen rather small around a central portion of microlens 19b, as shown in FIGS. 17A and 17B, then it is determined that the light-gathering ratio of microlens 19b for shape inspection is low and has a incorrect shape. At this time, since a plurality of base patterns 23 of square shapes having sizes differing little by little from one another are formed as shown in FIG. 9, what shape microlenses 19 of the imaging device have, that is, the degree of the error of the shape from a desired shape, can be determined through investigating whose image is magnified over the whole microlens 19b.

Also, a fixed tolerance can be set with this base pattern 23 as a reference and used to determine whether microlenses 19 formed are acceptable or to be rejected. It is to be noted that, according to the production method of the present embodiment described above, since both microlenses 19 are formed in the same shape and in the same size, a result of an inspection due to microlenses 19b for shape inspection also applies as it is to light-gathering microlenses 19a.

Also it is to be noted that the shape of base patterns 23 is not limited to a square, but may alternatively be a circle, a diamond-shape, a triangle, a star shape or a polygon. However, in order to simplify formation (patterning) of base patterns 23, a very complicated shape is not desirable.

Figure 19:
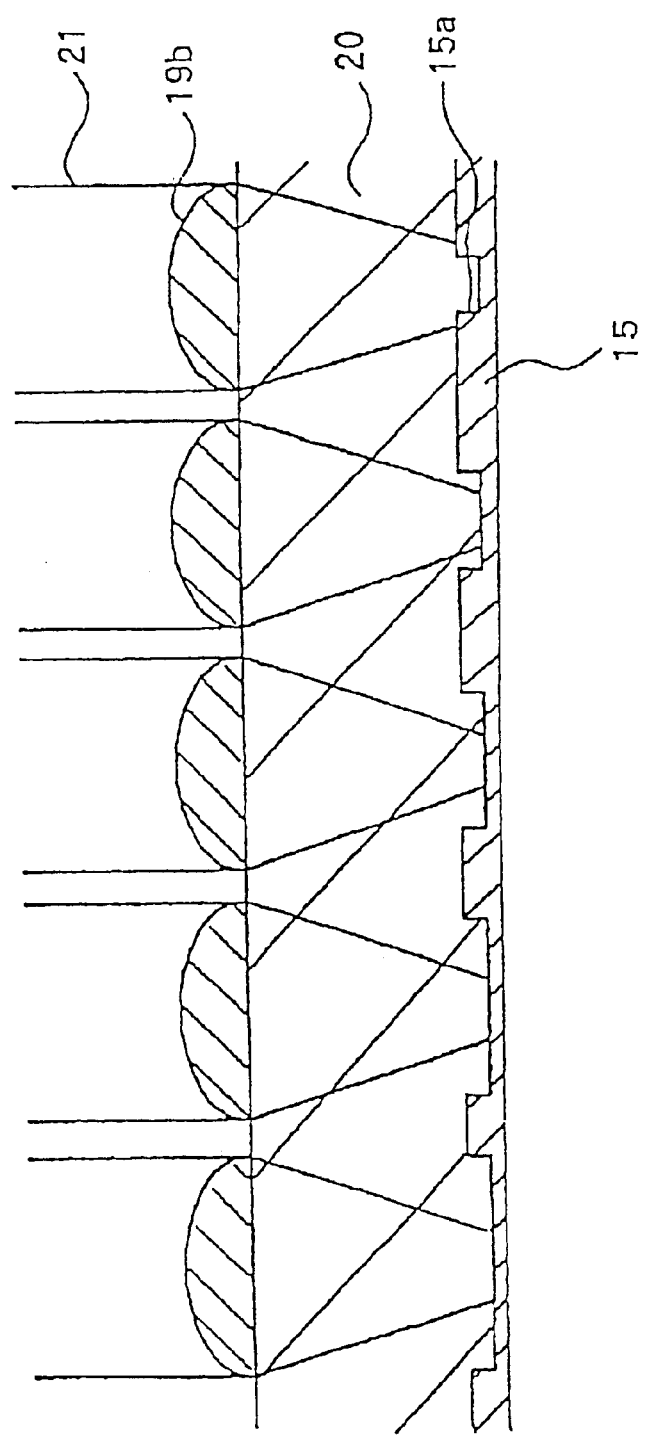
FIG. 19 is an enlarged sectional view of essential part showing an example wherein a further base pattern is formed on the imaging device shown in FIG. 8.

As an alternative, base patterns 24 made of a resin film such as a polycrystalline silicon film may be formed as shown in FIG. 18. Also, it is possible to form base patterns 15a by providing shoulders on insulating layer as shown in FIG. 19. Furthermore, though not shown, such patterns as mentioned above may be reversed to form base patterns having a negative indication of, for example, void squares. In such reverse patterns, there is no risk that, upon formation of fine base patterns, the patterns may go out of sight and cannot be observed.

Figure 20:
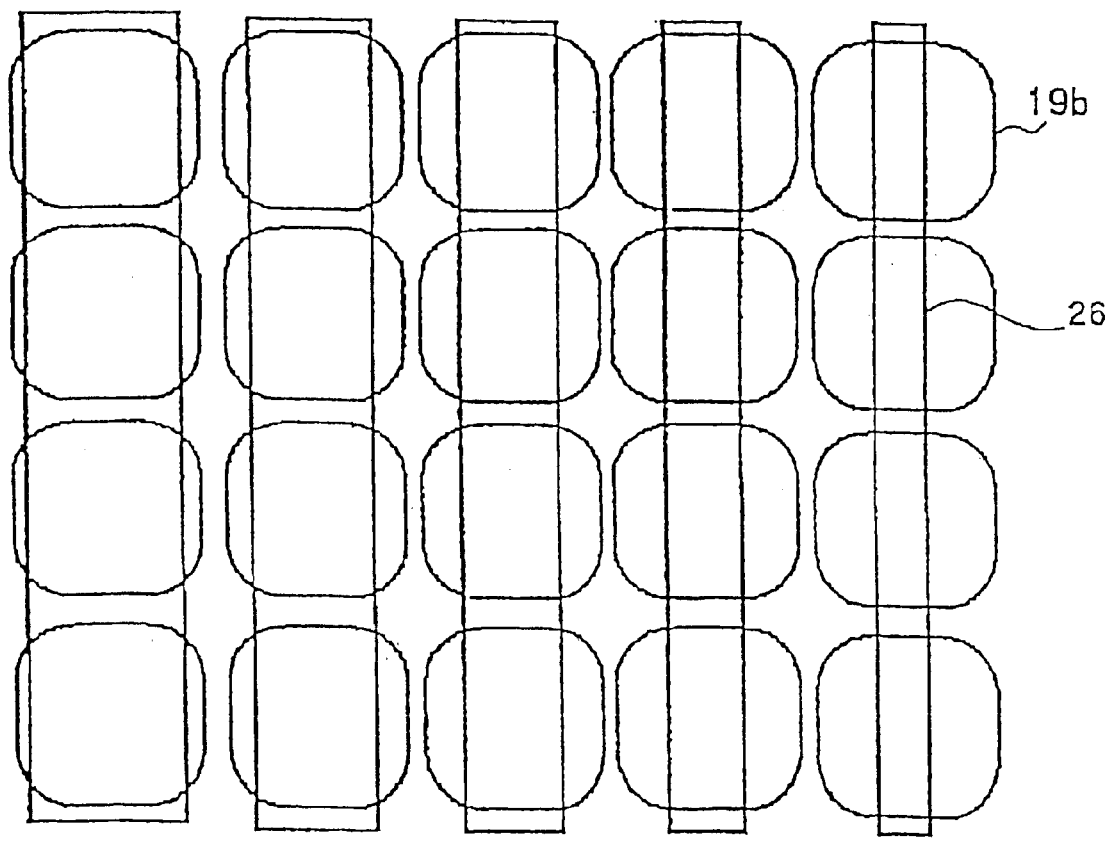
FIG. 20 is an enlarged plan view of a microlens for shape inspection and a base pattern of a second embodiment of the present invention.
Figure 21:
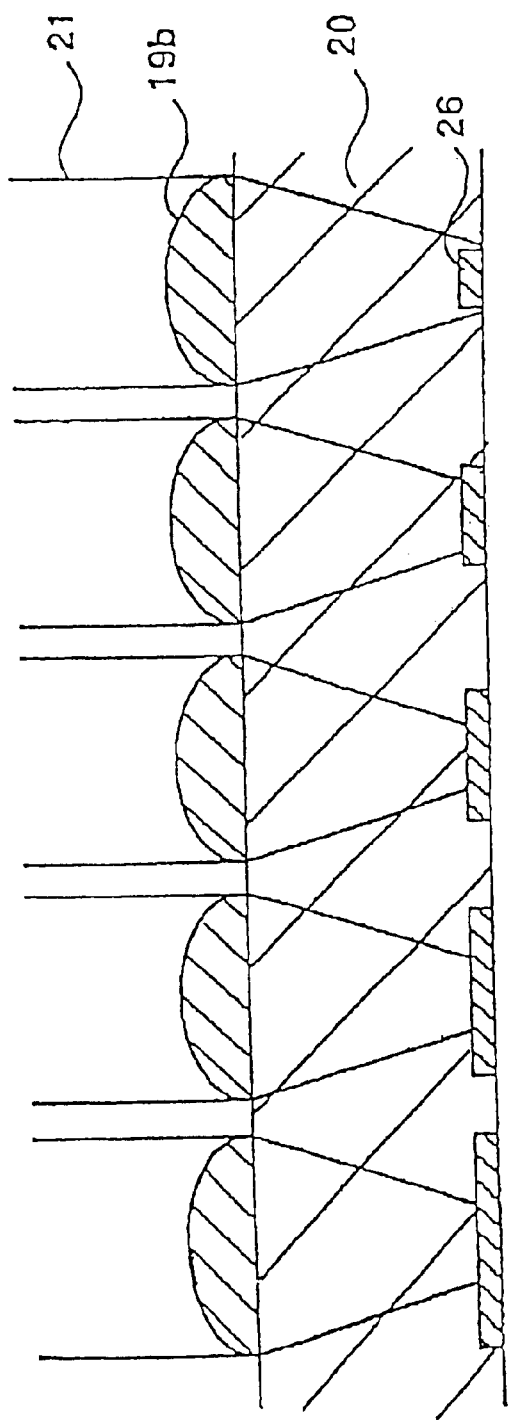
FIG. 21 is an enlarged sectional view of essential part of the imaging device shown in FIG. 20.

Referring to FIG. 20 and 21, there is illustrated an imaging device according to a second embodiment of the present invention. The image device is substantially the same as the first embodiment except base pattern 26, and will be described only simply.

Base patterns 26 for shape inspection are formed by patterning a metal film in field area 8. Each of base patterns 26 has a rectangular shape extending through a microlens row, whose widths differ from one another for individual rows of the microlenses. In the example shown, five microlens rows are provided, and five rows of rectangular base patterns 26 are associated with the microlens rows. The widths of base patterns 26 exhibit a gradual increase from the rightmost row toward the leftmost row in FIGS. 20 and 21.

Figure 22A:
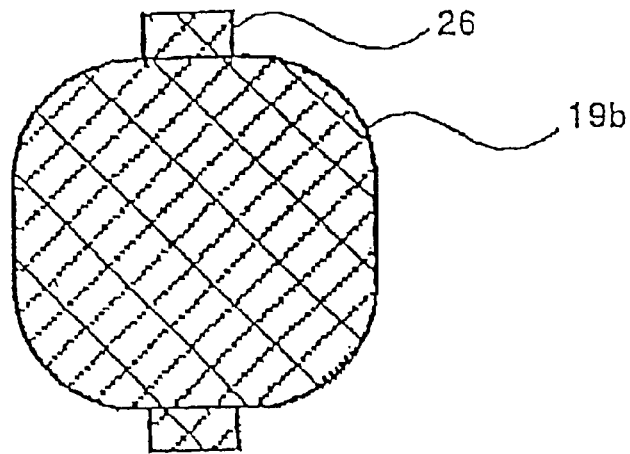
FIG. 22A is a plan view showing an image of a base pattern through the microlens for shape inspection in an example of a shape inspection of a microlens according to the imaging device shown in FIG. 20.
Figure 22B:
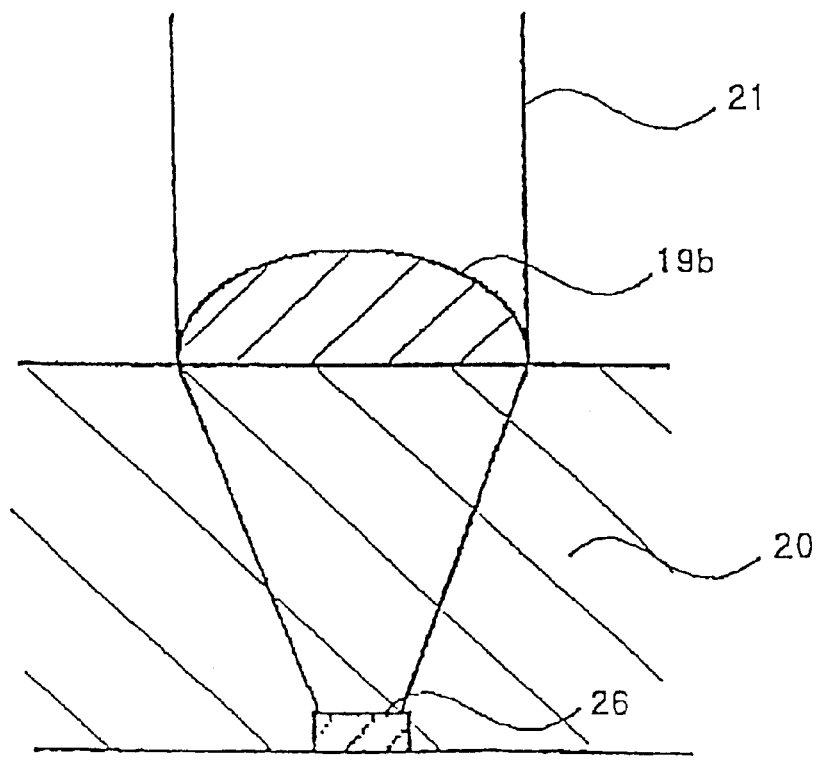
FIG. 22B is a sectional view showing an image of the base pattern through the microlens for shape inspection in the example of a shape inspection of the microlens according to the imaging device shown in FIG. 20.

A method of detecting the shapes of microlenses 19b for shape inspection in the present embodiment will be described. When observing base patterns 26 for shape inspection shown in FIGS. 20 and 21 through a microscope, rectangular base patterns 26 look differently depending upon the shapes of microlenses 19b for shape inspection, and an inspection can be performed accordingly. For example, if predetermined base pattern 26 looks fully 25 occupying microlens 19b for shape inspection as shown in FIGS. 22A and 22B, then it is determined that microlenses 19b for shape inspection of a suitable shape having a high light-gathering ratio are formed.

Figure 23A:
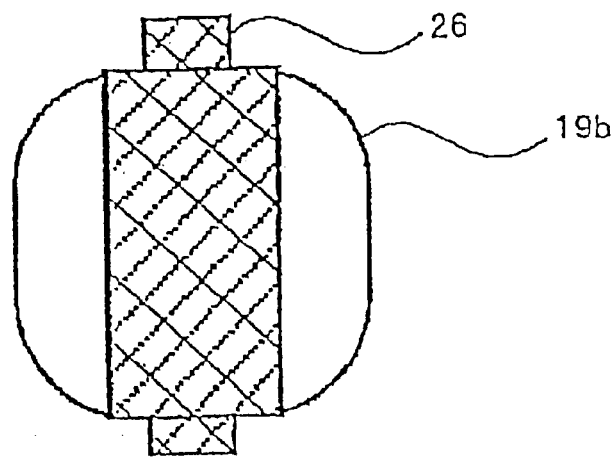
FIG. 23A is a plan view showing an image of a base pattern through the microlens for shape inspection in a different example of a shape inspection of a microlens according to the imaging device shown in FIG. 20.
Figure 23B:
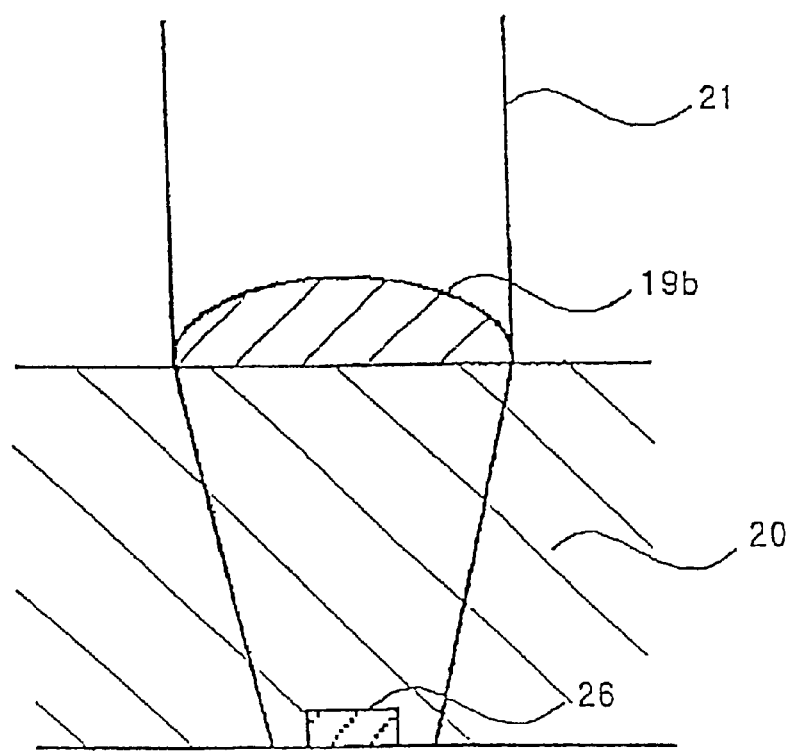
FIG. 23B is a sectional view showing an image of the base pattern through the microlens for shape inspection in the different example of a shape inspection of the microlens according to the imaging device shown in FIG. 20.

On the other hand, if the same base pattern 26 does not look fully occupying microlens 19b for shape inspection but looks thinner around a central portion of microlens 19b for shape inspection as shown in FIGS. 23A and 23B, then it is determined that microlens 19b is not precise in shape and has a low gathering ratio. In this instance, since the five rows of rectangular base patterns 23 having widths a differing little by little from one another are formed in the present embodiment, what shape microlenses 19 of the imaging device have, that is, the degree of an error of the shape from a desired shape can be determined through which one of base patterns 23 looks having a width sufficient to fully occupy microlens 19b. In addition, it is possible to set a fixed tolerance with base pattern 26 as a reference and determine whether microlenses 19 formed are acceptable or to be rejected.

Although not shown, base patterns 26 may be formed from a resin film such as a polycrystalline silicon film, or may be formed by providing shoulders or steps on an insulating film. Furthermore, such patterns as mentioned above may be reversed to form base patterns having a negative indication of, for example, void squares. Such reverse patterns as just mentioned there is no risk that, upon formation of fine base patterns, the patterns may go out of sight and cannot be observed.

Figure 24:
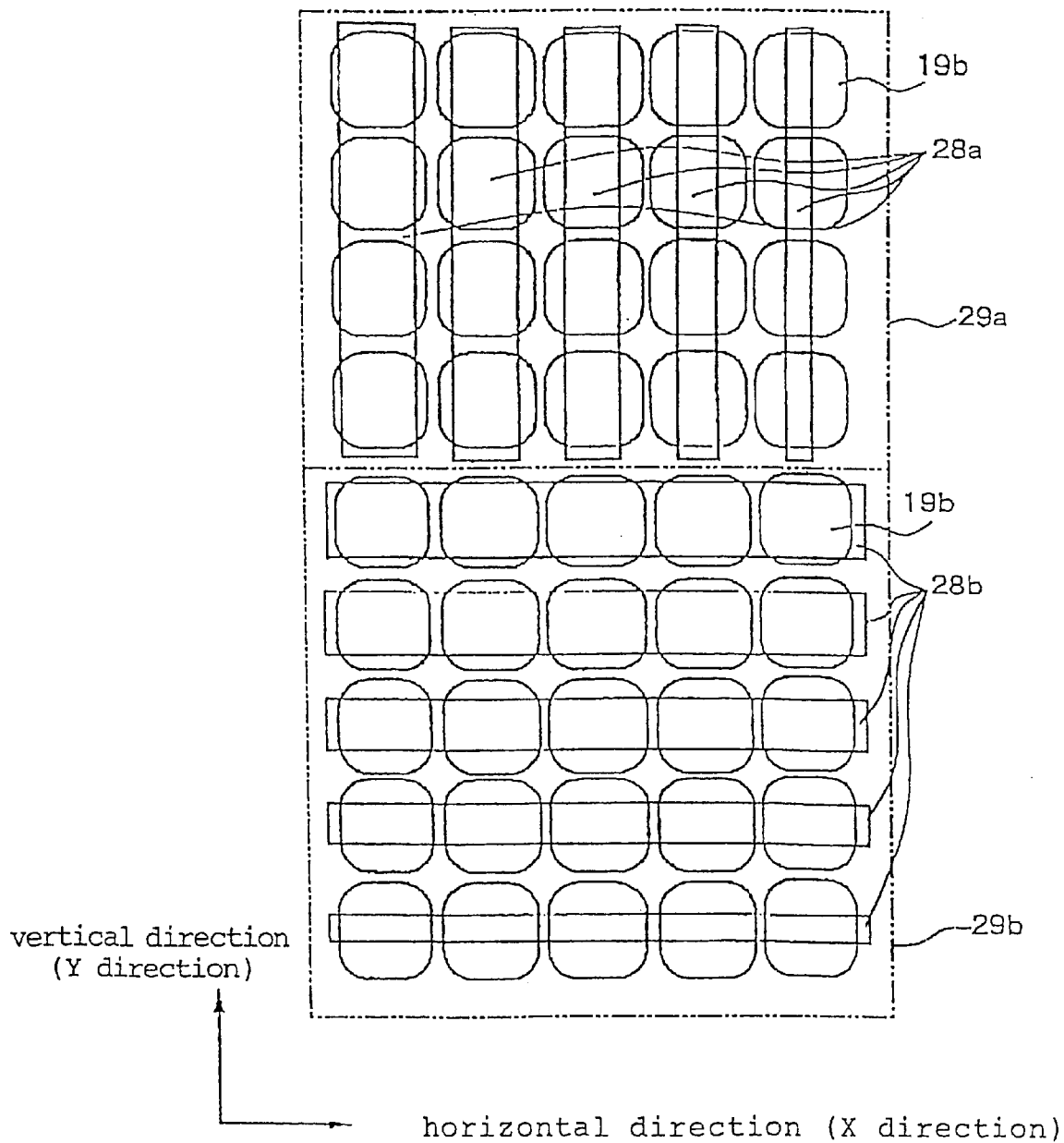
FIG. 24 is an enlarged plan view of a microlens for shape inspection and a base pattern of a third embodiment of the present invention.

Referring to FIG. 24, there is illustrated an imaging device according to a third embodiment of the present invention. The imaging device is substantially the same as that of the first embodiment except the number of micro-lenses 19b for shape inspection and also in base patterns 28a and 28b, and will therefore be described briefly.

Base patterns 28a and 28b for shape inspection are formed by patterning a metal film in field area 8. Base patterns 28a are substantially the same as base patterns 26 in the second embodiment and have elongated rectangular shapes individually extending through microlens rows in their longitudinal directions and having different widths from one another for the individual rows of the microlenses. Base patterns 28b have shapes equivalent to those of base patterns 26 of the second embodiment rotated by 90 degrees and have elongated rectangular shapes extending through the microlens rows in horizontal directions (X directions) and having widths differing from one another for the individual rows of the microlenses.

In the example, shown microlenses of five vertical columns and nine horizontal rows are provided and are divided into two regions of upper portion 29a including four horizontal rows and lower portion 29b including five horizontal rows. Base patterns 28a of upper portion 29a have widths which exhibit a gradual increase from the rightmost row toward the leftmost row of FIG. 24, but base patterns 28b of lower portion 29b have widths which exhibit a gradual increase from the lowermost row toward the uppermost row of FIG. 24.

Also in the present embodiment, similarly as in the second embodiment, the shapes of microlenses 19b for shape inspection can be inspected through observing images of base patterns 28a and 28b through microlenses 19b for shape inspection by means of a microscope. It is to be noted that, in upper portion 29a, the light-gathering ratio of microlenses 19b for shape inspection in the horizontal direction can be examined with base patterns 28a in the vertical direction. Meanwhile, in lower portion 29b, the light-gathering ratio of microlenses 19b for shape inspection in the vertical direction can be examined with base patterns 28b in the horizontal direction.

Although not shown, base patterns 28a and 28b of the present embodiment can also be formed from a polycrystalline silicon film shoulders of an insulating film, or may be formed as reversed patterns. If microlens arrays are prepared in an arbitrary angle direction and base rectangular patterns are formed in this direction, then the light-gathering ratio in the direction can be examined.

Figure 25:
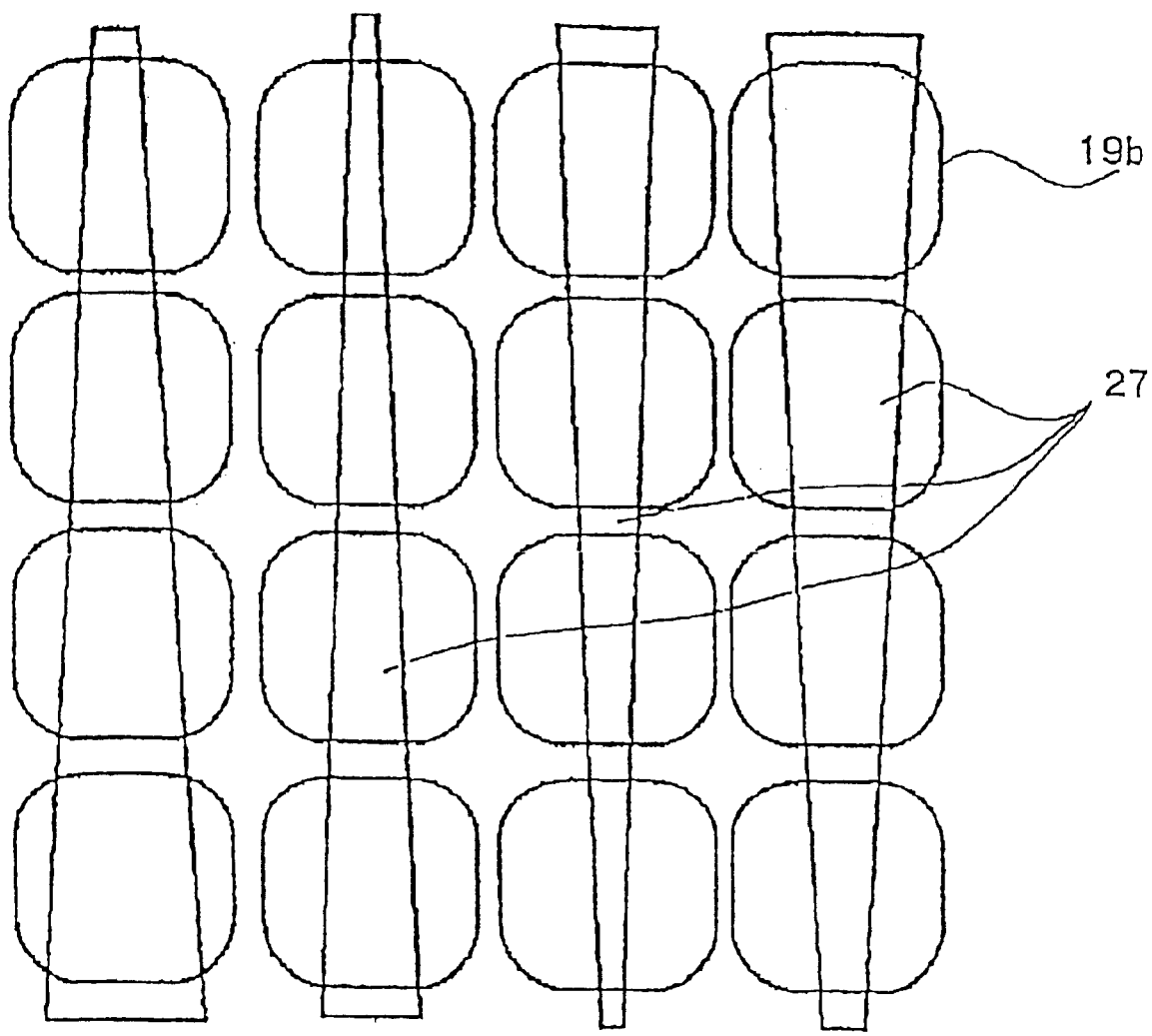
FIG. 25 is an enlarged plan view of a microlens for shape inspection and a base pattern of a fourth embodiment of the present invention.

FIG. 25 is a plan view of microlenses 19b and base patterns 27 for shape inspection in an imaging device according to a fourth embodiment of the present invention. The imaging device of the present embodiment is substantially the same as the first embodiment except the number of microlenses 19b for shape inspection and in base patterns 27, and the description thereof is partially.

Base patterns 27 for shape inspection are formed by patterning a metal film in field area 8. Base patterns 27 have tapering elongated trapezoidal shapes each having a width gradually decreasing from one end toward the other end and extending through a microlens row.

Figure 26A:
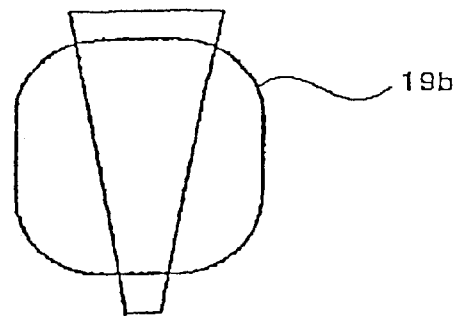
FIG. 26A is a plan view illustrating an actual positional relationship between the microlens for shape inspection and the base pattern in an example of a shape inspection of the microlens according to the imaging device shown in FIG. 25.
Figure 26B:
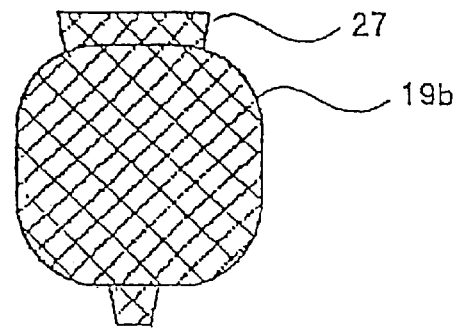
FIG. 26B is a plan view showing an image of the base pattern through the microlens for shape inspection in the example of a shape inspection of the microlens according to the imaging device shown in FIG. 25.
Figure 26C:
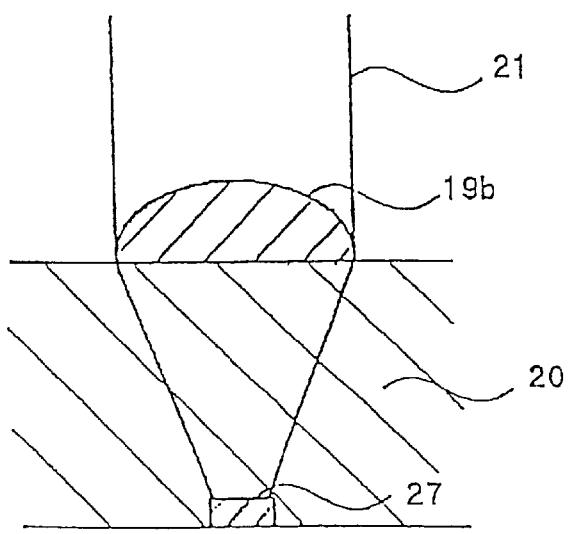
FIG. 26C is a sectional view showing an image of the base pattern through the microlens for shape inspection in the example of a shape inspection of the microlens according to the imaging device shown in FIG. 25.

A method of inspecting the shapes of microlenses 19b for shape inspection in the present embodiment will be described below. When base patterns 27 for shape inspection are observed through a microscope shown in FIG. 25, base patterns 27 look differently depending upon the shapes of microlenses 19b for shape inspection, and an inspection can be performed accordingly. For example, if predetermined base pattern 27 looks fully occupying microlens 19b for shape inspection as shown in FIGS. 26A to 26C, then it is determined that microlenses 19b of a suitable shape having a high light-gathering ratio are formed.

Figure 27A:
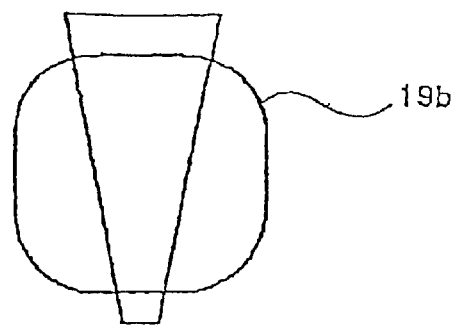
FIG. 27A is a plan view illustrating an actual positional relationship between the microlens for shape inspection and the base pattern in a different example of a shape inspection of the microlens according to the imaging device shown in FIG. 25.
Figure 27B:
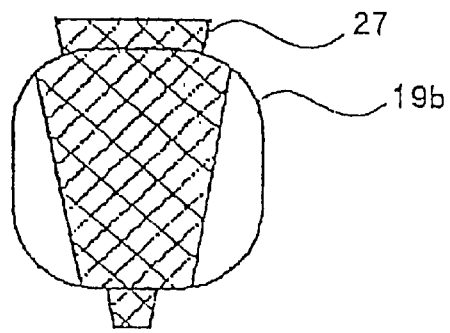
FIG. 27B is a plan view showing an image of the base pattern through the microlens for shape inspection in the different example of a shape inspection of the microlens according to the imaging device shown in FIG. 25.
Figure 27C:
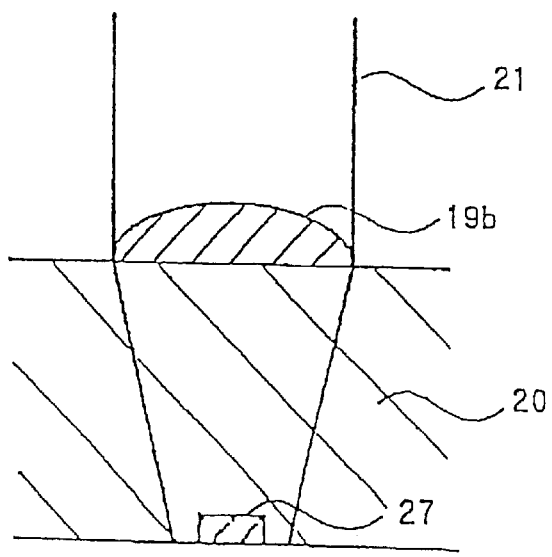
FIG. 27C is a sectional view showing an image of the base pattern through the microlens for shape inspection in the different example of a shape inspection of the microlens according to the imaging device shown in FIG. 25.
Figure 28A:
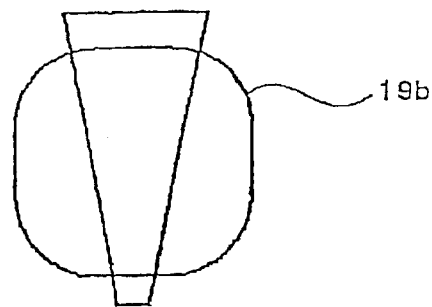
FIG. 28A is a plan view illustrating an actual positional relationship between the microlens for shape inspection and the base pattern in a further example of a shape inspection of the microlens according to the imaging device shown in FIG. 25.
Figure 28B:
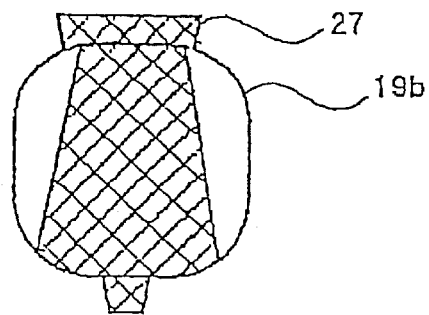
FIG. 28B is a plan view showing an image of the base pattern through the microlens for shape inspection in the further example of a shape inspection of the microlens according to the imaging device shown in FIG. 25.
Figure 28C:
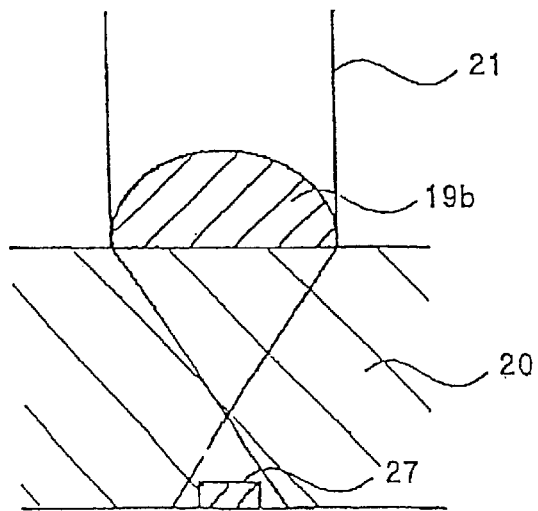
FIG. 28C is a sectional view showing an image of the base pattern through the microlens for shape inspection in the further example of a shape inspection of the microlens according to the imaging device shown in FIG. 25.

On the other hand, if the same base pattern 27 does not look fully occupying microlens 19b for shape inspection but looks thinner around a central portion of microlens 19b for shape inspection, then it is determined that microlens 19b is not precise in shape and has a low gathering ratio. If actual base pattern 27 for shape inspection has a downwardly tapering shape as shown in FIG. 27A and also an image of base pattern 28a or 28b through microlens 19b for shape inspection has a downwardly tapering shape as shown in FIG. 27B, it is determined that a focal point of microlens 19b for shape inspection is positioned farther away (downwardly in FIG. 27C) from base pattern 27 for shape inspection. Accordingly, in order to correct this, it is required to increase either the thickness of flattened layer 20 or microlens 19 or the radius of curvature of microlens 19. On the other hand, if actual base pattern 27 for shape inspection has a downwardly tapering shape as shown in FIG. 28A, and an image of base pattern 28a or 28b through microlens 19b for shape inspection has an upwardly tapering shape as shown in FIG. 28B, then it is determined that a focal point of microlens 19b for shape inspection is positioned nearer than (upwardly in FIG. 28C from) base pattern 27 for shape inspection as shown in FIG. 28C. Accordingly, in order to correct this, it is required to decrease either the thickness of flattened layer 20 or microlens 19 or the radius of curvature of microlens 19.

As explained above, the present embodiment offers an advantage that it is determined that the shape of the microlenses is not precise but also what defect in shape the microlenses have, and consequently, a method of correcting this can be determined.

Though not shown, base patterns 27 for shape inspection in the present invention can also be formed by a polycrystalline silicon film shoulders of an insulating film or as reversed patterns.

While, in the explanation embodiments of the present invention, an interline transfer type CCD imaging device has been described as a solid state imaging device, the present invention can also be applied to imaging devices of the other types. For example, the present invention can also be applied to various imaging devices such as a frame interline transfer type CCD, a full frame transfer type CCD, a MOS type image sensor, a CMOS type image sensor and an active pixel type image sensor, provided that the imaging device includes microlenses formed on photoelectric conversion elements.

While preferred embodiments of the present invention have been described using specific terms, such description is for illustrative purposes only, and it is to be understood that changes and variations may be made without departing from the spirit or scope of the following claims.

What is claimed is:

1. A solid state imaging device comprising:
   a plurality of photoelectric conversion elements arranged on an imaging area of a semiconductor substrate;
   a light-gathering microlens disposed above each of said photoelectric conversion elements, for gathering light on the photoelectric conversion element; and
   a microlens for shape inspection disposed outside said imaging area of said semiconductor substrate and having the same shape as that of the light-gathering microlens.

2. A solid state imaging device according to claim 1, wherein a base pattern for inspection is formed below the microlens for shape inspection.

3. A solid state imaging device according to claim 2, wherein said base pattern comprises a metal film pattern, a polycrystalline silicon film pattern or a pattern provided by a shoulder of an insulating film.

4. A solid state imaging device according to claim 2, wherein a plurality of microlenses for shape inspection are arranged, and said base patterns associated with the microlenses for shape inspection have sizes differing from each other.

5. A solid state imaging device according to claim 4, wherein all of the base patterns are smaller than the microlenses for shape inspection.

6. A solid state imaging device according to claim 2, wherein a plurality of said microlenses for shape inspection are arranged in a row, and the base patterns of elongated rectangular shapes are formed extending in the direction of arrangement of the microlenses for shape inspection.

7. A solid state imaging device according to claim 6, wherein the widths of the base patterns are smaller than those of the microlenses for shape inspection.

8. A solid state imaging device according to claim 7, wherein a plurality of rows of the microlenses for shape inspection are provided and the widths of the base patterns different among the microlens rows for shape inspection.

9. A solid state imaging device according to claim 6, wherein the base patterns have rectangular shapes.

10. A solid state imaging device according to claim 7, wherein the base patterns have rectangular shapes.

11. A solid state imaging device according to claim 8, wherein the base patterns have rectangular shapes.

12. A solid state imaging device according to claim 6, wherein each of the base patterns has an elongated trapezoidal shape having a width which gradually decreases from its one end to its other end.

13. A solid state imaging device according to claim 7, wherein each of the base patterns has an elongated trapezoidal shape having a width which gradually decreases from its one end to its other end.

14. A solid state imaging device according to claim 8, wherein each of the base patterns has an elongated trapezoidal shape having a width which gradually decreases from its one end to its other end.

15. A method of inspecting a solid state imaging device which includes a plurality of photoelectric conversion elements arranged in an imaging area of a semiconductor substrate, a light-gathering microlens disposed above each of said photoelectric conversion elements for gathering light on the photoelectric conversion element, a microlens for shape inspection disposed outside said imaging area of said semiconductor substrate and having a shape same as that of the light-gathering microlens, and a base pattern formed below the microlens for shape inspection, comprising the step of observing an image of each of the base patterns through a corresponding one of the microlenses for shape inspection to inspect the shape of the microlens for shape inspection.

16. A method of producing a solid state imaging device, comprising the steps of:
  arranging a plurality of photoelectric conversion elements in an imaging area of a semiconductor substrate; and
  forming, above said photoelectric conversion elements, light-gathering microlenses for gathering light to said photoelectric conversion elements and, outside said imaging area of said semiconductor substrate, a microlens for shape inspection having the same shape as that of said light-gathering microlenses.

17. A method of producing a solid state imaging device according to claim 16, wherein said light-gathering microlenses and said microlens for shape inspection are formed simultaneously.

18. A method of producing a solid state imaging device according to claim 16, wherein a base pattern for inspection is formed outside said imaging area of said semiconductor substrate, and then, said microlens for shape inspection is formed on said base pattern.

19. A method of producing a solid state imaging device according to claim 17, wherein a base pattern for inspection is formed outside said imaging area of said semiconductor substrate, and then, said microlens for shape inspection is formed on said base pattern.

20. A method of producing a solid state imaging device according to claim 18, wherein said base pattern is formed from a metal film pattern, a polycrystalline silicon film pattern or a pattern provided by a shoulder of an insulating film.

21. A method of producing a solid state imaging device according to claim 19, wherein said base pattern is formed from a metal film pattern, a polycrystalline silicon film pattern or a pattern provided by a shoulder of an insulating film.

* * * * *